(12) United States Patent
Anderson et al.

(10) Patent No.: US 7,363,115 B2
(45) Date of Patent: **\*Apr. 22, 2008**

(54) BATCH MIXING METHOD WITH FIRST DERIVATIVE HOMOGENEITY MONITORING

(75) Inventors: Gary R. Anderson, Austin, TX (US); Matt Fowler, Austin, TX (US)

(73) Assignee: Tres-Ark, Inc., Austin, TX (US)

( \* ) Notice: Subject to any disclaimer, the term of this patent is extended or adjusted under 35 U.S.C. 154(b) by 0 days.

This patent is subject to a terminal disclaimer.

(21) Appl. No.: 11/484,020

(22) Filed: Jul. 10, 2006

(65) Prior Publication Data
US 2007/0043472 A1    Feb. 22, 2007

Related U.S. Application Data

(63) Continuation-in-part of application No. 11/177,930, filed on Jul. 8, 2005.

(51) Int. Cl.
*G05D 11/02* (2006.01)
*G05D 11/16* (2006.01)
*G05D 7/00* (2006.01)
*G05B 21/00* (2006.01)

(52) U.S. Cl. .................. 700/285; 700/265; 700/282; 700/283; 702/23; 366/132

(58) Field of Classification Search ......... 700/266, 700/265, 285; 702/23, 25, 30; 366/152.1, 366/136, 132
See application file for complete search history.

(56) References Cited

U.S. PATENT DOCUMENTS 3,826,904 A    7/1974    Leonard et al.
3,896,312 A    7/1975    Brown et al.
3,987,808 A   10/1976    Carbonell et al.
3,997,786 A   12/1976    Lauer et al.
4,251,870 A    2/1981    Jaffe
4,363,742 A   12/1982    Stone
4,403,866 A    9/1983    Falcoff et al.

(Continued)

OTHER PUBLICATIONS

Co-pending U.S. Appl. No. 11/484,021 entitled "Point-Of-Use-Mixing Method With Standard Deviation Homogeneity Monitoring" to Anderson et al. filed Jul. 10, 2006, available in PAIR.

(Continued)

*Primary Examiner*—Zoila Cabrera
*Assistant Examiner*—Nate Laughlin
(74) *Attorney, Agent, or Firm*—Meyertons, Hood, Kivlin, Kowert & Goetzel, P.C.

(57) ABSTRACT

There is disclosed a system and method of formulating a batch comprising at least two chemicals. An embodiment is disclosed wherein a feedforward algorithm can be used to control the target blend. Subsequently a feedback closed loop control loop algorithm is provided for a multivariant blend. Use of this approach allows for a continuously autoreplenished and controlled blend. Also disclosed is the ability to control via feedforward and feedback algorithms a fast responding control mode that allows for the elimination of a container. This approach will allow for "one pass" blending with control. The controller implements an automated fault detection and correction system, thereby identifying necessary maintenance prior to failure. If failure does occur the signature recognition allows rapid analysis and correction thus maximizing tool availability.

22 Claims, 12 Drawing Sheets

U.S. PATENT DOCUMENTS

| | | |
|---|---|---|
| 4,766,551 A | 8/1988 | Begley |
| 4,798,954 A | 1/1989 | Stevenson |
| 4,975,581 A | 12/1990 | Robinson et al. |
| 4,994,671 A | 2/1991 | Safinya et al. |
| 5,117,370 A | 5/1992 | DeCello et al. |
| 5,121,338 A | 6/1992 | Lodder |
| 5,124,932 A | 6/1992 | Lodder |
| 5,153,140 A | 10/1992 | Langfeld et al. |
| 5,225,679 A | 7/1993 | Clarke et al. |
| 5,262,961 A | 11/1993 | Farone |
| 5,340,210 A | 8/1994 | Patel et al. |
| 5,348,003 A | 9/1994 | Caro |
| 5,348,389 A | 9/1994 | Jonsson et al. |
| 5,446,681 A | 8/1995 | Gethner et al. |
| 5,452,232 A | 9/1995 | Espinosa et al. |
| 5,475,612 A | 12/1995 | Espinosa et al. |
| 5,522,660 A | 6/1996 | O'Dougherty et al. |
| 5,586,066 A | 12/1996 | White et al. |
| 5,592,402 A | 1/1997 | Beebe et al. |
| 5,606,164 A | 2/1997 | Price et al. |
| 5,632,960 A | 5/1997 | Ferri, Jr. et al. |
| 5,712,797 A | 1/1998 | Descales et al. |
| 5,740,073 A | 4/1998 | Bages et al. |
| 5,763,883 A | 6/1998 | Descales et al. |
| 5,874,049 A | 2/1999 | Ferri, Jr. et al. |
| 5,924,794 A | 7/1999 | O'Dougherty et al. |
| 5,982,486 A | 11/1999 | Wang |
| 6,012,019 A | 1/2000 | Saby |
| 6,050,283 A | 4/2000 | Hoffman et al. |
| 6,070,128 A | 5/2000 | Descales et al. |
| 6,100,526 A | 8/2000 | Mayes |
| 6,117,601 A | 9/2000 | Kanazawa et al. |
| 6,120,175 A | 9/2000 | Tewell |
| 6,159,255 A | 12/2000 | Perkins |
| 6,179,954 B1 | 1/2001 | Kawana et al. |
| 6,290,384 B1 | 9/2001 | Pozniak et al. |
| 6,421,614 B1 | 7/2002 | Goldman et al. |
| 6,438,440 B1 | 8/2002 | Hayashi |
| 6,445,969 B1 | 9/2002 | Kenney et al. |
| 6,464,799 B1 | 10/2002 | Lerner et al. |
| 6,507,401 B1 | 1/2003 | Turner et al. |
| 6,604,849 B2 * | 8/2003 | Lin et al. .................. 366/154.2 |
| 6,630,672 B1 | 10/2003 | Brotherton et al. |
| 6,665,576 B2 | 12/2003 | Hayashi |
| 6,681,187 B2 | 1/2004 | Ishii et al. |
| 6,707,556 B2 | 3/2004 | Turner et al. |
| 6,732,017 B2 | 5/2004 | Pham et al. |
| 6,762,832 B2 | 7/2004 | Fisher et al. |
| 6,766,275 B2 | 7/2004 | Samata et al. |
| 6,799,883 B1 | 10/2004 | Urquhart et al. |
| 6,862,484 B2 | 3/2005 | Hayashi |
| 6,969,190 B1 | 11/2005 | McClain et al. |
| 2002/0155541 A1 | 10/2002 | Naughton et al. |
| 2002/0188367 A1 | 12/2002 | Hayashi |
| 2003/0023390 A1 | 1/2003 | Ishii |
| 2003/0095472 A1 * | 5/2003 | Fukui ........................ 366/152.1 |
| 2003/0199649 A1 | 10/2003 | Orbison et al. |
| 2003/0233198 A1 | 12/2003 | Taguchi et al. |
| 2004/0007180 A1 | 1/2004 | Yamasaki et al. |
| 2004/0034479 A1 | 2/2004 | Shimase et al. |
| 2004/0098161 A1 | 5/2004 | Taguchi et al. |
| 2004/0100860 A1 * | 5/2004 | Wilmer et al. ............... 366/136 |
| 2004/0199293 A1 | 10/2004 | Pham et al. |
| 2004/0228186 A1 | 11/2004 | Kadota |
| 2004/0236522 A1 * | 11/2004 | Howes et al. .................. 702/31 |
| 2005/0029170 A1 * | 2/2005 | Urquhart et al. ........... 210/96.1 |
| 2006/0009875 A1 | 1/2006 | Simpson et al. |

OTHER PUBLICATIONS

Co-pending U.S. Appl. No. 11/484,019 entitled "Point-Of-Use-Mixing Method With First Derivative Homogeneity Monitoring" to Anderson et al. filed Jul. 10, 2006, available in PAIR.

Co-pending U.S. Appl. No. 11/484,014 entitled "Batch Mixing Method With Standard Deviation Homogeneity Monitoring" to Anderson et al. filed Jul. 10, 2006, available in PAIR.

PCT Search Report for International Application No. PCT/US04/41053 mailed May 23, 2005, 1 page.

PCT Search Report and Written Opinion for International Application No. PCT/US2006/026691 mailed Jan. 4, 2007; 10 pages.

PCT Search Report and Written Opinion for International Application No. PCT/US2006/026687 mailed Jan. 4, 2007; 10 pages.

* cited by examiner

US 7,363,115 B2

BATCH MIXING METHOD WITH FIRST DERIVATIVE HOMOGENEITY MONITORING

PRIORITY CLAIM

This application is a continuation-in-part of U.S. patent application Ser. No. 11/177,930 entitled "Chemical Mixing Apparatus, System and Method", filed Jul. 8, 2005, which is incorporated herein by reference in its entirety.

BACKGROUND OF THE INVENTION

1. Field of the Invention

The present invention relates in general to an apparatus, system and method for mixing chemicals. More particularly the present invention general relates to such an apparatus, system and method for mixing chemicals in a precise manner in accordance with a given formulation.

2. Description of the Relevant Art

This section describes the background of the disclosed embodiment of the present invention. There is no intention, either express or implied, that the background art discussed in this section legally constitutes prior art.

Currently, many manufacturing processes require the use of blended chemical compositions to treat parts during different steps of the process. Historically, these blended compositions have depended upon the input chemical control devices to achieve the desired mixture, then the mixture is tested in line for acceptable use. In some cases, an external analytical instrument or laboratory is used to confirm the blended mixture. In some other cases, an in-line test on the product is used.

While these methods may be successful for some applications to assure quality of process, they each may employ unwanted and undesirable delays. If the test fails, draining and refilling the chemistry subsequent to the test results may be required. This may result in unacceptable delays, additional costs and additional cycle time to the manufacturing process in certain applications.

It is therefore desirable to have improved methods of preparing compositions for use in manufacturing processes in an efficient and highly accurate manner. Such process should be able to consistently and accurately produce compositions having a predetermined formulation.

SUMMARY

An apparatus, systems and methods for mixing chemicals are disclosed herein. The apparatus, systems and methods disclosed herein may be applicable to both batch processing of chemical compositions and point of use or single pass compositions. The apparatus, systems and methods disclosed herein may be used for mixing of solids, liquids, gases and combinations thereof.

In one embodiment, a method of producing a composition, the composition including two or more chemicals, includes: obtaining a total flow rate for the composition; determining the flow rate for each chemical, wherein the sum of the flow rates for each chemical equals the total flow rate, and wherein the flow rate of each chemical is determined based on a predetermined composition formulation; initiating flow of each chemical into a mixing area, wherein each chemical is flowed at the determined flow rate, and wherein the chemicals are combined in the mixing area to produce the composition; transferring the composition into an analyzer, wherein the analyzer is configured to measure the quantity of one or more chemicals of the composition; determining the homogeneity of the composition as the composition is flowed through the analyzer; and designating the composition as properly mixed if one or more chemicals of the composition is within a predetermined concentration range and the homogeneity of the composition is greater than or equal to a predetermined homogeneity value.

In another embodiment, a method of formulating a batch, includes: admitting at least two chemicals to a given size container to a fraction of the full container volume for a desired batch; determining the homogeneity of the mixture in the partially filled container; determining the quantities of each chemical in the container after the homogeneity of the mixture is greater than or equal to a predetermined homogeneity value; determining the quantity of each component needed to fill the container to a predetermined level; dispending the determined quantities of the chemicals into the container. The quantity of each component needed to fill the container to the predetermined level may be calculated as a function of the determined quantity of one or more chemicals in the mixture. The above-described methods may also be embodied on a computer readable medium and in a controller of a chemical mixing system.

Homogeneity of a composition or mixture may be determined as a function of an average variation of the quantity of one or more components over a predetermined period of time. In one embodiment, the homogeneity of the composition may be determined from the average deviation of the quantity of one or more chemicals of the composition with respect to an average quantity of the chemicals of the composition over a predetermined time period. Determining the average deviation includes: collecting a predetermined number of quantity measurements for one or more chemicals in the composition over a predetermined time period; determining the average quantity of one or more chemicals in the composition for the plurality of concentration measurements taken over the predetermined time period; determining, for each measured quantity of one or more chemicals of the composition, the standard deviation of the measured quantity with respect to the average quantity; determining one or more average standard deviation values of one or more of the chemicals; determining the homogeneity of the composition, wherein the homogeneity of the composition is a function of one or more average standard deviations. The homogeneity of the composition may be determined as a function of the average standard deviation of a single chemical or of two or more chemicals.

In another embodiment, the homogeneity of a composition may be determined from an average change in concentration of one or more chemicals of the composition over a predetermined period of time. Determining the average change in concentration includes: taking a plurality of quantity measurements of the composition over a predetermined time period; determining the change in quantity with respect to time for each quantity measurement; determining one or more average change in quantity with respect to time of one or more of the chemicals; determining the homogeneity of the composition, wherein the homogeneity of the composition is a function of one or more average changes. In another embodiment, the homogeneity of a composition may be determined from an average deviation of one or more chemicals of the composition with respect to a model concentration of the one or more components of the composition over a predetermined period of time.

In another embodiment, a method of forming a composition includes starting a blending apparatus, wherein the blending apparatus includes: a container; two or more chemical dispensing devices, each chemical dispensing device having an input and an output, each input coupled to a chemical supply and each output coupled to the container; and a controller coupled to the chemical dispensing devices. A zero point control signal is then sent from the controller to at least one of the chemical dispensing devices, wherein the zero point control signal causes the chemical dispensing device to move to a zero flow state configuration. After the chemical dispensing devices receive the zero point control signal, one or more of the chemical dispensing devise are monitored for fluid flowing through the chemical dispensing device, wherein if fluid flow is detected through one or more of the chemical dispensing devices, one or more of the chemical dispensing devices are adjusted until flow of fluid through the one or more chemical dispensing devices is inhibited. Once proper adjustment of one or more chemical dispensing devices has been achieved, a dispense control signal is sent to one or more of the chemical dispensing devices, wherein the dispense control signal causes the chemical dispensing device to dispense one or more chemicals into the container. A similar method may be used for a point of use system, in which the container described above is replaced by a mixer.

The above-described methods may be used for a variety of compositions. In some embodiments the composition may be an aqueous solution of one or more chemicals. Examples of chemicals that may be used in a composition include inorganic bases, mineral acids, and peroxides (e.g., hydrogen peroxide).

A variety of analyzers may be used to determine the quantity of one or more of the chemicals in a mixture or composition. In some embodiments, an analyzer may be a spectral absorption analytical device (e.g., a Raman spectrophotometer). In other embodiments, an analyzer may be a conductance measurement device. The term "analyzer" as used herein refers to a single analytical device or a plurality of analytical devices.

BRIEF DESCRIPTION OF THE DRAWINGS

Other objects, features and advantages of the invention will appear on reading the following description, given as a non-limiting example, and made with reference to the appended drawings in which.

Figure 1:
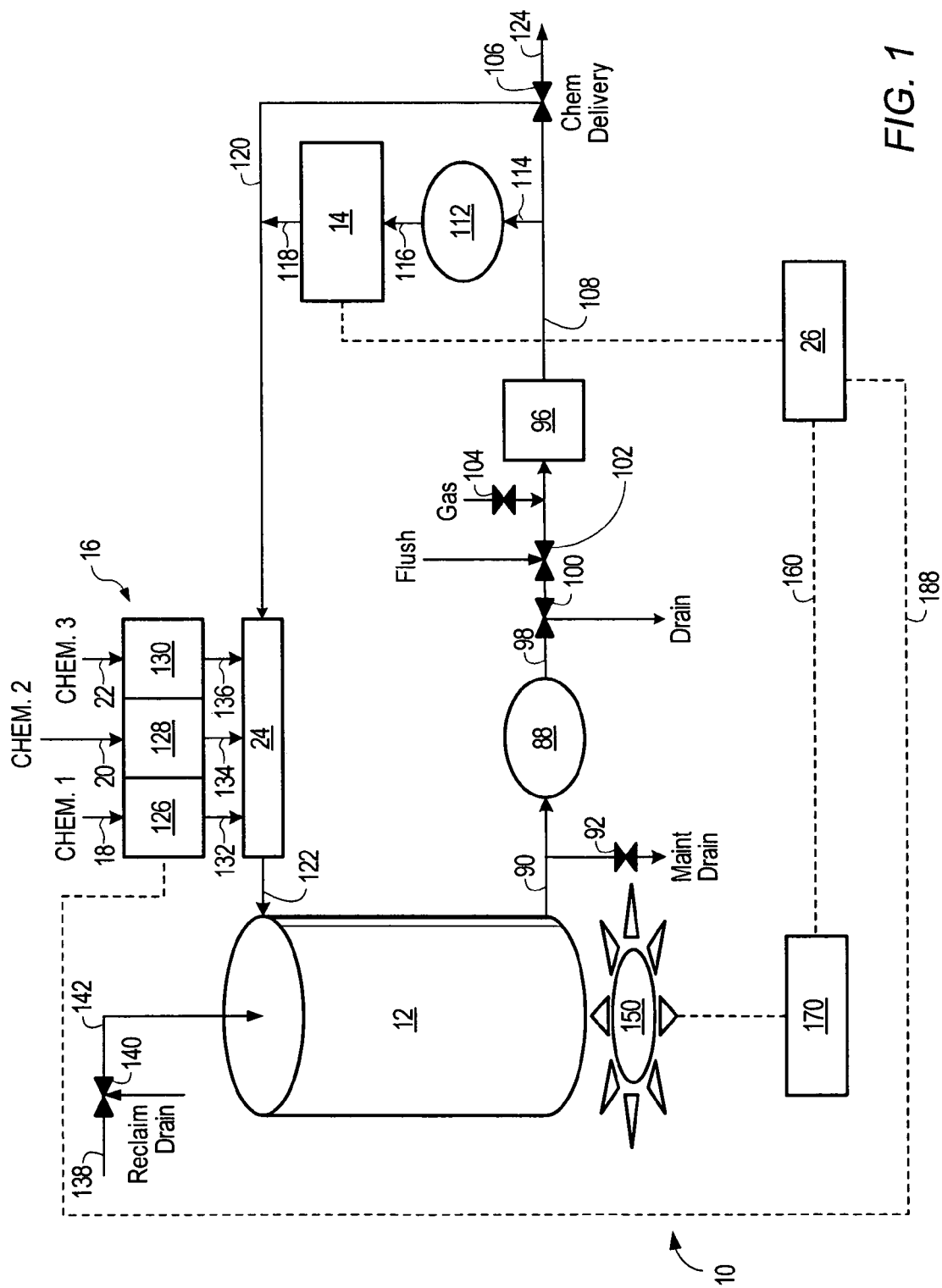
FIG. 1 is a schematic view of a chemical mixing system.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

According to certain embodiments, there is provided a system and method of formulating a composition comprising at least two chemicals. Chemicals that may be used include, but are not limited to acids (e.g., inorganic acids, mineral acids, and organic acids), bases (e.g., inorganic bases and organic bases), and carrier fluids (e.g., water, alcohols, etc.). Chemicals that may be mixed include solids, liquids, gases and combinations thereof. Generally, the chemicals are dispensed into a container to partially fill it. The quantities of the chemicals in the container are determined, and a ratio of a target quantity to the determined current quantity for at least one chemical is calculated. As used herein the "quantity" of a chemical refers to any of the following measurements of the chemical: weight, volume, weight percent, volume percent and concentration. The next quantity of that chemical to be admitted to the admixture is calculated by multiplying the target quantity by the calculated ratio to determine a corrected quantity. The corrected quantity of the chemical is dispensed to the admixture, and a quantity of another chemical is admitted to the admixture to adjust the proportion of chemicals to the target formulation. These steps may be repeated until a desired quantity of a predetermined composition is produced. Systems and methods for blending chemicals in this manner are described in U.S. Published Patent Application 2006/0009875 published Jan. 12, 2006 and U.S. patent application Ser. No. 11/177,930, both of which are incorporated herein by reference.

According to certain embodiments, there is provided a fractional fill mixing apparatus, system and method for mixing chemicals to form a composition. In one embodiment, the fractional fill apparatus, system and method includes a container for holding chemicals, an in-line analytical instrument for measuring the quantity of one or more chemicals disposed within the container, and one or more chemical dispensing devices for dispensing chemicals into the container. A controller is operatively coupled to one or more of the chemical dispensing devices and the analytical instrument. The controller further employs a fractional fill algorithm for dispensing at least two chemicals to the container to a fraction of the full volume for a desired batch.

According to certain embodiments of the invention, a controller executes the fractional fill mixing algorithm to cause an initial fraction of the total volume of the container to be filled in the filling sequence. This fractional volume is recirculated to assure a homogeneous mixture, and the in-line analytical instrument determines the constituent parts of the mixture and communicates the information regarding the current mixture to the controller. The controller executing a fractional fill mixing algorithm, adjusts the chemical dispensing devices in a manner that corrects errors between the actual values and the desired values of the chemicals in the composition in subsequent fractions or portions of the total volume of the composition. The resulting composition is the desired mixture and no additional testing is required for many applications.

Referring now to the drawings and, more particularly, to FIG. 1, there is shown a fractional fill mixing apparatus or system 10, which is used to combine two or more chemicals in a tank or container 12. It should be understood, that while the system depicted is configured for mixing of liquids, modifications can be made to such system to allow mixing of solids and gases as well as, or in combination with liquids. An analyzer or analytical instrument 14 is configured to measure the quantities of each chemical in container 12. While only one analyzer is depicted, it should be understood that a plurality of analytical devices may be used to perform different types of analytical tests. Chemical dispensing devices, shown generally at 16, controllably dispense two or more chemicals into container 12. Chemical dispensing devices 16 dispense chemicals received from a plurality of chemical supply inlets, such as first chemical supply inlet 18, second chemical supply inlet 20, and third chemical supply inlet 22. Each chemical supply inlet 18, 20, and 22, is coupled to a plurality of chemical supply sources (e.g., containers containing bulk chemicals). A manifold 24 receives the plurality of chemicals from chemical dispensing devices 16. The chemicals then flow from manifold 24 to container 12.

Figure 2:
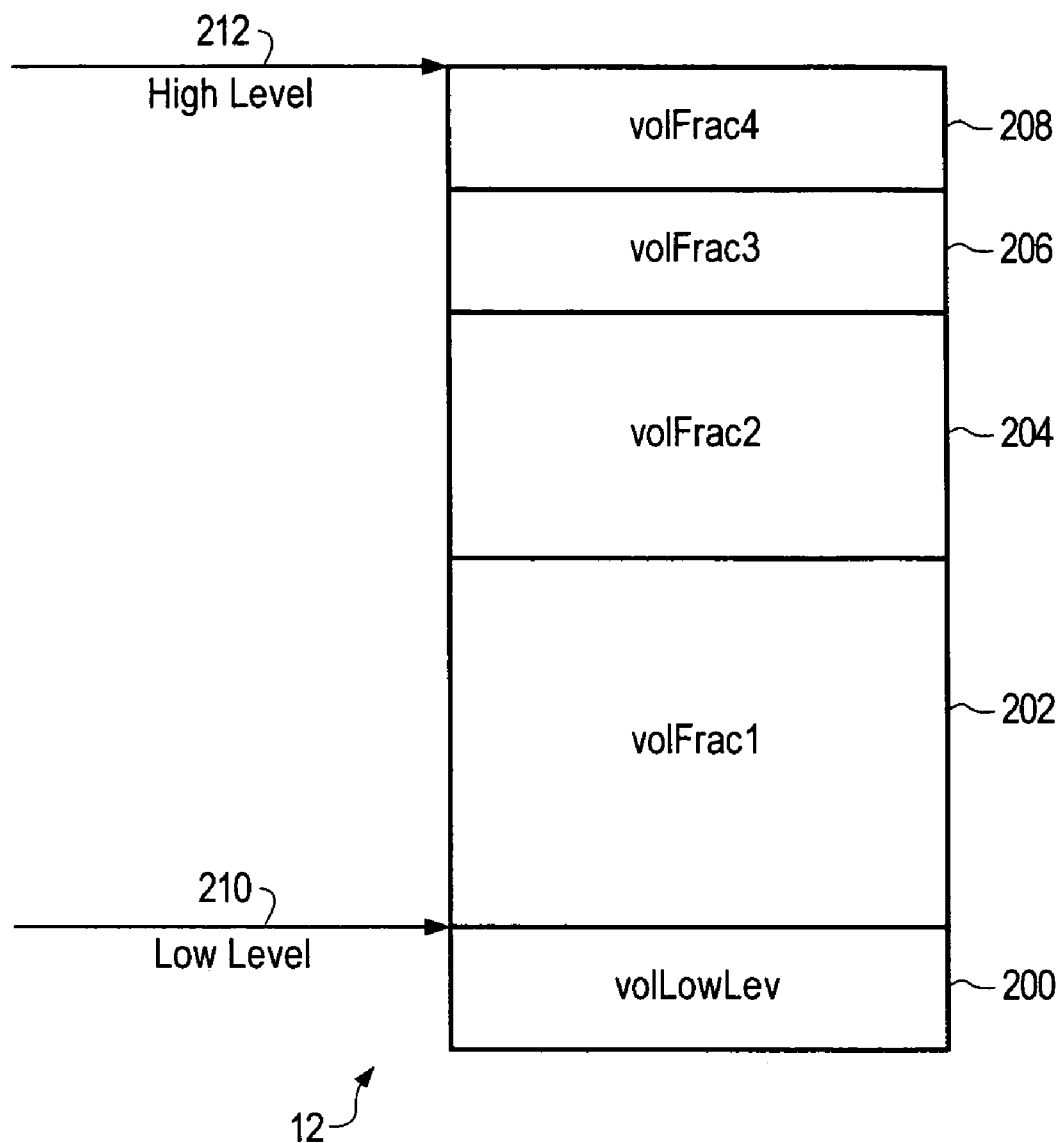
FIG. 2 is a schematic cross-sectional view of a container being filled using a fractional fill method.

As shown in FIG. 2, in use, according to a fractional fill mixing algorithm, container 12 initially may contain a residual volume of one or more of the chemicals to be mixed, as indicated by volLowLev 200. The low volume of container 12 is indicated generally at 210. According to an embodiment, container 12 is then fractionally filled through two or more fractional or partial filling sequences, the volume of each are indicated at 202, 204, 206, and 208, respectively. As indicated in FIG. 2, for example, a fractional filling sequence generally may include four fractional filling sequences volFrac1, volFrac2, volFrac3, and volFrac4. It should be noted that container 12 may have additional volume capacity above high-volume point 212 (not shown). Thus, high-volume point 212 indicates the volume that will be achieved when the fractional fill sequence is complete but not necessarily indicates the maximum capacity of container 12.

Figure 3:
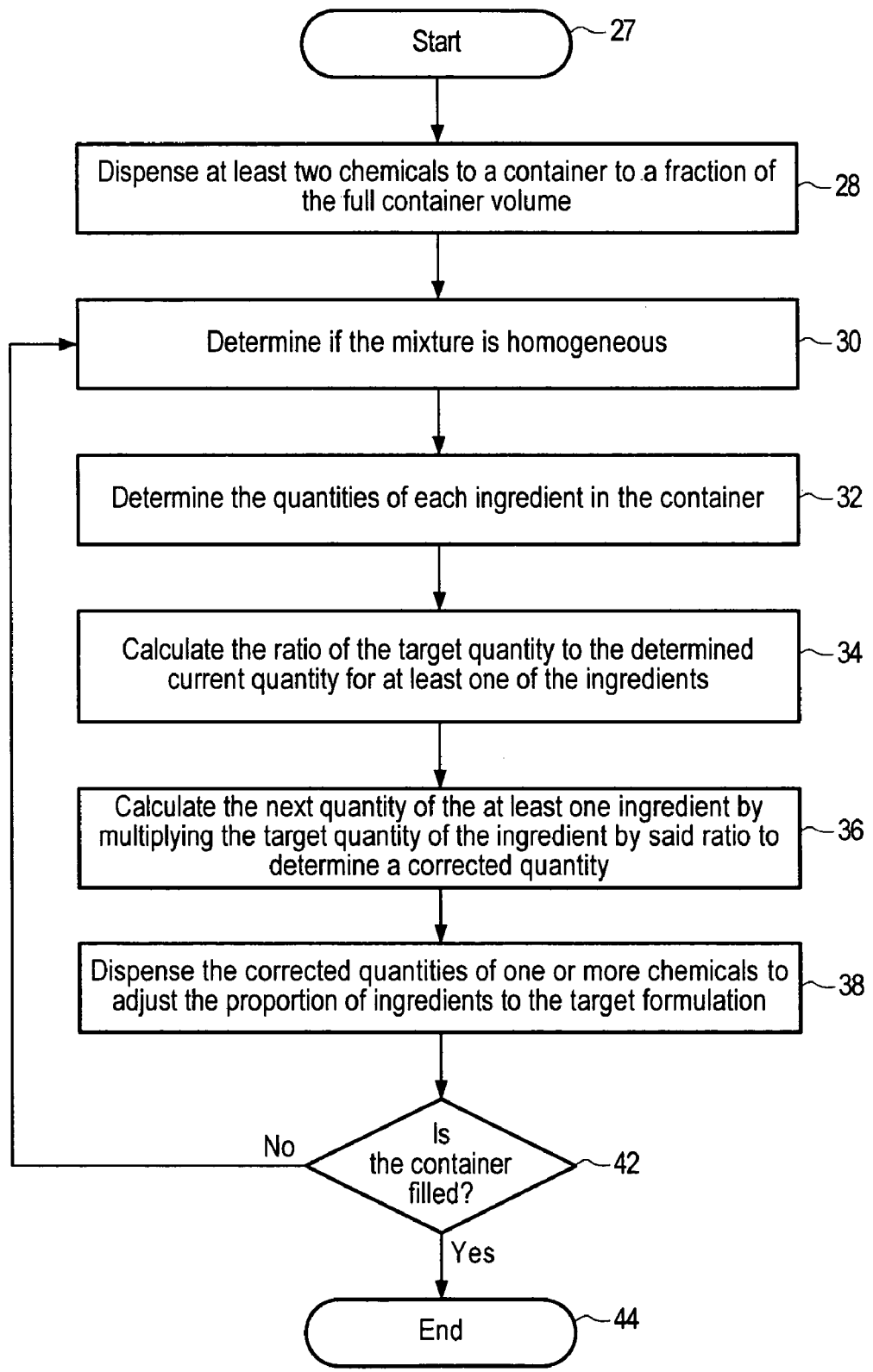
FIG. 3 is a flow chart of a fractional fill mixing method.

As shown in FIG. 3, the fractional fill mixing method begins in block 27. The fractional fill mixing method dispenses at least two chemicals to container 12 to a fraction of a predetermined volume of a desired composition to be produced (28). The mixture may be blended using a mixing device. Blending of the chemicals in the container is continued until the mixture is determined to be substantially homogeneous (30). If the mixture is not homogeneous, blending of the chemicals may be continued until the mixture is substantially homogeneous. A quantity of each chemical in the container is then determined (32). The quantities of each chemical measured in container 12 may be in weight, volume, percent by weight, percent by volume, or as a concentration. The method then calculates the ratio of the determined current quantity for at least one of the chemicals to the target quantity for the desired composition (34). The method then calculates the next quantity of at least one chemical needed by multiplying the target quantity of the chemical by the calculated ratio (34) to determine a corrected quantity (36). The method then directs one or more of the chemical dispensing devices 16 to dispense the corrected quantity of one or more of the chemicals to the 35 admixture in container 12 (38). The process as shown in blocks 30, 32, 34, 36, and 38 may be repeated until the container is filled (42) to the desired volume of the composition. When container 12 is filled to the desired volume of the composition, the process terminates (44).

Considering now the method as just described in greater detail, and with reference to FIG. 2, the method includes determining a desired fractional filling sequence to be performed. Specifically, the number of fractional fills, and the quantity of each fractional fill, is determined by a user. For example, FIG. 2 shows a container 12 that will contain the intermediate admixtures and, ultimately, the final desired volume of the composition to be created from the method. FIG. 2 shows a plurality of volume levels representing successive fractional fill sequences. In the present example, four fractional filling sequences are to be performed, however it should be understood that more or less than four fractional filing sequences may be used. In an embodiment, the first fractional filling sequence fills container 12 to approximately 50% of its volume as shown by area 202. This volume is indicated as volFrac 1. The partial fill volume is equal to 50% in this example including the residual volume as indicated by volLowLev 200. The residual volume is the volume of a residual chemical or composition already present in the container 12 before the fractional fill method is commenced. There may or may not be a residual volume, as it depends on the user requirements. The residual volume of the chemical or composition in container 12 normally includes one or more chemicals that will form part of the current batch. The second fractional fill fills the container an additional 25% of volume as indicated by the area 204 where the volume for this fractional fill is represented by volFrac 2. The third and fourth fractional volumes, volFrac 3 and volFrac 4 indicated by 206 and 208, respectively, each fill the container an additional 12.5% until the container is approximately full as indicated by arrow 212.

The fractional volumes and percentages just recited are for example purposes only and could be modified as desired to achieve various filling sequences as will become apparent to those skilled in the art. More or less fractional filling sequences may be used to achieve a desired volume of a predetermined composition. For example, instead of four fractional filling sequences, three fractional filling sequences could be used where each fractional volume sequence could include 33% or one-third of the approximate container volume.

The total volume of the composition in container 12, according to the exemplary fractional filing sequence is represented by the variable totalVol which equals (VolLowLev+volFrac 1+volFrac 2+volFrac 3+volFrac 4). totalVol may also be represented by (chem1TotalVol+chem2TotalVol+diwAddedVol). chem1TotalVol represents the total volume of the first chemical in the composition. chem2TotalVol represents the total volume of the second chemical in the composition. DiwAddedVol represents the volume of the third chemical, typically deionized water, in the composition. It should be noted that diwAddedVol represents the third chemical and normally is deionized water but may be any other chemical that is desired to be part of the batch. For the sake of clarity for subsequent examples, the residual volume of the admixture in container 12 is assumed to be the same chemical as diwAddedVol, the third chemical of the exemplary batch, so that when diwAddedVol and VolLowLev are combined, the total volume of the third chemical results.

The fractional fill mixing method then begins by filling the container to the first fractional fill percentage in the sequence. In our example, this is 50% as represented by VolFrac1 202, as best shown in FIG. 2. The actual volume of the first chemical to meet the requirements for the current fractional fill sequence is then calculated. This volume is represented by chem1FracVol. chem1FracVol is equal to chem1TotalVol·pourUp1Frac where pourUp1Frac is a fractional fill percentage of the first fill sequence, in the present example, 50%. chem2FracVol is calculated using a similar formula.

Calculation of the total volume of the first chemical must then be calculated as represented by chem1TotalVol. chem1TotalVol is defined as chem1Ratio·x where x is an intermediate variable. x is defined as TotalVol÷(chem1Ratio+chem2Ratio+diwRatio). chem1Ratio and chem2Ratio are defined as the ratio of the volume to be filled for the first and second chemicals, respectively. diwRatio is a ratio of the volume to be filled for the third chemicals.

The volume of the third chemical added to VolLowLev to obtain totalVol is defined as diwAddedVol which equals (diwRatio·x)−VolLowLev.

The fractional fill mixing method next includes calculating the target quantity of one chemical based on the target volumetric blending ratio and the supply concentration of the chemical. The target quantity of one chemical is referred to as concChem1, which is defined as (chem1Ratio·bulkChem1)÷(chem1Ratio+chem2Ratio+diwRatio). Where chem1Ratio and chem2Ratio and diwRatio represent the ratios of the volume to be filled for the first, second, and third chemical, respectively, for the current fractional fill sequence. BulkChem1 represents the supply concentration of the first chemical. The target quantity of the other chemicals are calculated using similar formulas where the numerator of the above equation is replaced with the ratio and concentration of the bulk chemical supply from the respective chemical being calculated. Now that chem1FracVol has been calculated, chem2FracVol and diwFracVol are also calculated as just described.

At this point in the method for fractional fill mixing according to one embodiment of the invention, the first fraction is poured by controller 26 sending a signal to chemical supply control device 16 to dispense the volume of chemical represented by chem1FracVol, then to dispense the volume of chemical represented by chem2FracVol, and finally to dispense the volume of chemical as represented by diwFracVol. Depending on what type of chemical supply control device 16 is employed, the controller 26 may drive the supply control device 16 to dispense the required amount of chemicals using suitable equipment, such as pumps or gravity feed dispensing devices for flow controllers or others. For pumps, for example, the number of strokes of the pump may be conventionally calculated by the controller 12 and for gravity fed dispensing devices, the dispensing time may be conventionally calculated by the controller 12.

Each chemical is dispensed by chemical control devices 126, 128, and 130 into container 12. In some embodiments, a manifold 24 is used to collect chemicals from each of the chemical control devices and deliver the chemicals to container 12. In container 12, blending of the chemicals may occur. Blending may be accomplished by the process of admitting the chemicals into the container or using various mechanical means to blend the chemicals together. After the chemicals have been added to container 12, a portion of the admixture may be sent to an analyzer to determine the quantities of one or more of the chemicals in the container. In some embodiment, determining the quantities includes determining: a concentration of one or more of the chemicals; a weight percent of one or more of the chemicals; or a volume percent of one or more of the chemicals.

In order to more accurately determine if the quantities of one or more chemicals that are measured in container 12 are the true quantities of one or more of the chemicals, a homogeneity analysis of the composition may be performed.

In one embodiment, the homogeneity of an admixture disposed in container 12 may be determined as a function of an average variation of the quantity of one or more chemicals of the admixture over a predetermined time. When the homogeneity of the admixture reaches a predetermined minimum value, the admixture may be considered to be homogeneous. Once the admixture is considered to be homogenous, the quantity of one or more of the chemicals may be determined and used for the subsequent calculations.

Now that the first fractional fill has been admitted to container 12, subsequent fractional fill sequences must be calculated and admitted to container 12. To perform the remaining fractional fill sequences, an ideal chemical fraction, such as idealChem1Frac, may be calculated. An ideal chemical fraction may be calculated for each chemical to be admitted to container 12. By way of example, idealChem1Frac is defined as (chem1TotalVol·pourUp2Frac) where chem1TotalVol represents the total volume of the first chemical to meet the requirements for the current fractional fill sequence and pourUp2Frac is the subsequent fractional fill percentage in the sequence. For example, since this is the second correction fill sequence, pourUp2Frac in this example would now be equal to 25%. Other ideal chemical fractions may also be calculated for each chemical by using a similar formula where chem1TotalVol is replaced with the total volume of the other chemical being evaluated.

Next, the actual volume of each chemical to meet the requirements for the current fractional fill sequence must be calculated. By way of example, the actual volume of the first chemical to meet the requirements for the current fractional fill sequence is represented by chem1FracVol which is defined as (idealChem1Frac·concChem1)÷chem1Val where chem1Val is the measured quantity or concentration of the first chemical in the batch. A similar formula may be used to calculate the actual volumes of the other chemicals to be added to the admixture during this fractal fill sequence where the theoretical quantity/concentration of the other chemicals, ideal chemical fractions, and measured quantities/concentrations may be replaced in the appropriate portions of the above formula.

The method further includes calculating the difference between the ideal and actual volume of the first chemical, chem1FracDelta. This is calculated by subtracting chem1FracVol from idealChem1Frac. The same formula is used for the second chemical to calculate chem2FracDelta using its actual volume to meet the requirements of the current fractional fill sequence and ideal chemical fraction.

The actual volume of the third chemical to meet the requirements for the current fractional fill sequence may use a different formula. diwFracVol is equal to (diwAddedVol·pourUp2Frac)+chem1FracDelta+chem2FracDelta where diwAddedVol is the volume of the third chemical at its VolLowLev to obtain total volume for the third chemical. This, as discussed above, assumes that VolLowLev, which represents the residual volume in the container, is the same chemical as the third chemical. chem1FracDelta is defined as the difference between the ideal and actual volume of the first chemical and chem2FracDelta is defined as the difference between the ideal and actual volume of the second chemical. Thus, diwFracVol serves to volumetrically fill the remaining volume for the current fractional fill sequence.

As previously stated, diwAddedVol represents the volume of the third chemical added to VolLowLev to obtain total volume. diwAddedVol is defined as diwRatio·x−VolLowLev where x is defined as (TotalVol÷(chem1Ratio+chem2Ratio+ diwRatio)). If it is determined that diwFracVol is negative, diwFracVol is then reduced by multiplying the first chemical volume to be admitted to the admixture for the current fractional fill sequence by ((totalVol−VolLowLev)·pourUp2Frac)÷(chem1FracVol+chem2FracVol). The volume of the second chemical is also reduced by multiplying it by the same formula.

It should be noted that the target quantity of one chemical represented in percent by weight may be modified as a function of specific gravity of each chemical in the batch. For example, concChem1, by example, may be modified as a function of specific gravity by employing the following replacement formula (chem1Ratio·bulkChem1·sGravChem1)÷((chem1Ratio·sGravChem1)+(chem2Ratio·sGravChem2))+(diwRatio·sGravChem3) where concChem1 is the target concentration of the first chemical, chem1Ratio is a ratio of the volume to be filled for the first chemical. chem2Ratio is a ratio of the volume to be filled for the second chemical. diwRatio is the ratio of the volume to be filled for the third chemical. BulkChem1 is the supply concentration of the first chemical. sGravChem1, sGravChem2, sGravChem3 represent the specific gravity for the first, second, and third chemicals, respectively.

It should be noted that the above method may be used with concentrated bulk chemicals normally having the concentration measured in percent by weight. Therefore, in the foregoing examples, the formulas listed hereinabove in conjunction with the method for performing fractional fill mixing may use percent by weight concentration as the measure for quantity of the contemplated chemical in the admixture or from the chemical supply. Alternatively, in other contemplated examples of embodiments of the invention not disclosed herein, percent by volume concentration or other concentration measurement values may be used in some circumstances depending on the type of analytical instrument 14 in use.

Subsequent fractional fill sequences are then calculated and added to the admixture in container 12 using the same formulas and methods stated hereinabove for the foregoing examples.

An alternate control scheme is based on a concentration correction algorithm. The controller dosing algorithm may be based on the objective function:

$$m_i x_{n,i} + m_{i+1} x_{n,i} = x^*_n (m_i + m_{i+1})$$

where m represents the mass; i represents the iteration index, i.e., an index value representing the fraction being filled; n represents a component index value; and x is the liquid mass fraction. Any variable having the * symbol as a superscript represents a target or desired value. Note that the a symbol without a component index refers to a value of all components, or the overall value of that symbol. For example, $m_{i+j}$ connotes the total mass of the fill sequence iteration i+1, whereas $m_{n,i+1}$ implies only the mass component n in fill sequence iteration i+1. Generalized iteration indices are expressed relative to the present. For example, $V_i$ indicates the volume in the system at the end of the last fill iteration—i.e., the present volume; $V_{i+1}$ represents the volume in the next fill sequence iteration.

Assuming that the density of the current tank contents and the density of the mixture about to be dispensed are not vastly different, the ratio $m_i:m_{i+1}$ will be approximately equal to the ratio of $V_i:V_{i+1}$ where V is the volume of the liquid. Thus, after algebraic manipulation the dosing algorithm is:

$$x_{n,i+1} = x^*_n + (V_i/V_{i+1})(x^*_n - x_{n,i})$$

Using this relationship, the volume of any component needed to fill the container during a selected iteration of the fill sequence can be derived as follows. Since:

$$x_{n,i+1} = x^*_n + (V_i/V_{i+1})(x^*_n - x_{n,i}) = m_{n,i+1}/m_{i+1}$$

and where $$m_{i+1} = V_{i+1}\left(\sum_n x_{n,i+1} d_n\right)$$

$$m_{n,i+1} = x_{n,s} d_n V_{n,i+1}$$

The volume of the component may be determined from:

$$V_{n,i+1} = x_{n,i+1} V_{i+1}\left(\sum_n x_{n,i+1} d_n\right) \Big/ (x_{n,s} d_n)$$

where $x_{n,s}$ is the concentration of the supply source of component n and $d_n$ is the density of component n.

The error in at the end of any correction is used to modulate the "effective concentration" of the supply source of the components. After each filing sequence, the following error adaptation is performed to determine a corrected supply source concentration.

$$x_{n,s(corrected)} = (x_n/x^*_n) * x_{n,s(current)}$$

The corrected supply source concentration may be used for subsequent calculations.

In one embodiment, the fractional fill mixing apparatus, system, and method may be used for chemical blending or mixing concentrated chemicals for use in the manufacture of semiconductor wafers. Chemicals that may be used to prepare compositions for use in the manufacture of semiconductor wafers includes, but are not limited to an oxidizing agent (e.g., $H_2O_2$), a base (e.g., $NH_4OH$) or an acid (e.g., $HCl$, $H_2SO_4$, $HF$, $HNO_3$, $H_3COOH$). Additionally, compositions for use in the manufacture of semiconductor wafers include, but is not limited to water or IPA or another primary chemical constituent. The composition may be useful for echtant, selectivity, accelerants, suppressants, and dilute chemicals of interest as examples. Processes that employ these requirements include as examples cleans, etches, slurries, polymer removal and electroplating. Some examples of compositions are provided in Table 1. The column labeled "Label" refers to common industry nomenclature for the composition. The column "Alt Label" refers to an alternate designation for the listed composition. The listing "TEMP" refers to temperature of composition. Analytical technologies such as those supplied by spectral absorption or conductance technologies may be employed in making realtime insitu measurements of these specific compositions.

TABLE 1

| Label | Alt. Label | Chem 1 | Chem 2 | Chem 3 |
|---|---|---|---|---|
| SC1 | APM | $NH_4OH$ | $H_2O_2$ | $H_2O$ |
| HF | | HF | TEMP | — |
| SC2 | HPM | HCl | $H_2O_2$ | $H_2O$ |
| SPM | | $H_2SO_4$ | $H_2O_2$ | $H_2O$ |
| BHF | | $NH_4OH$ | HF | $H_2O$ |

Figure 4:
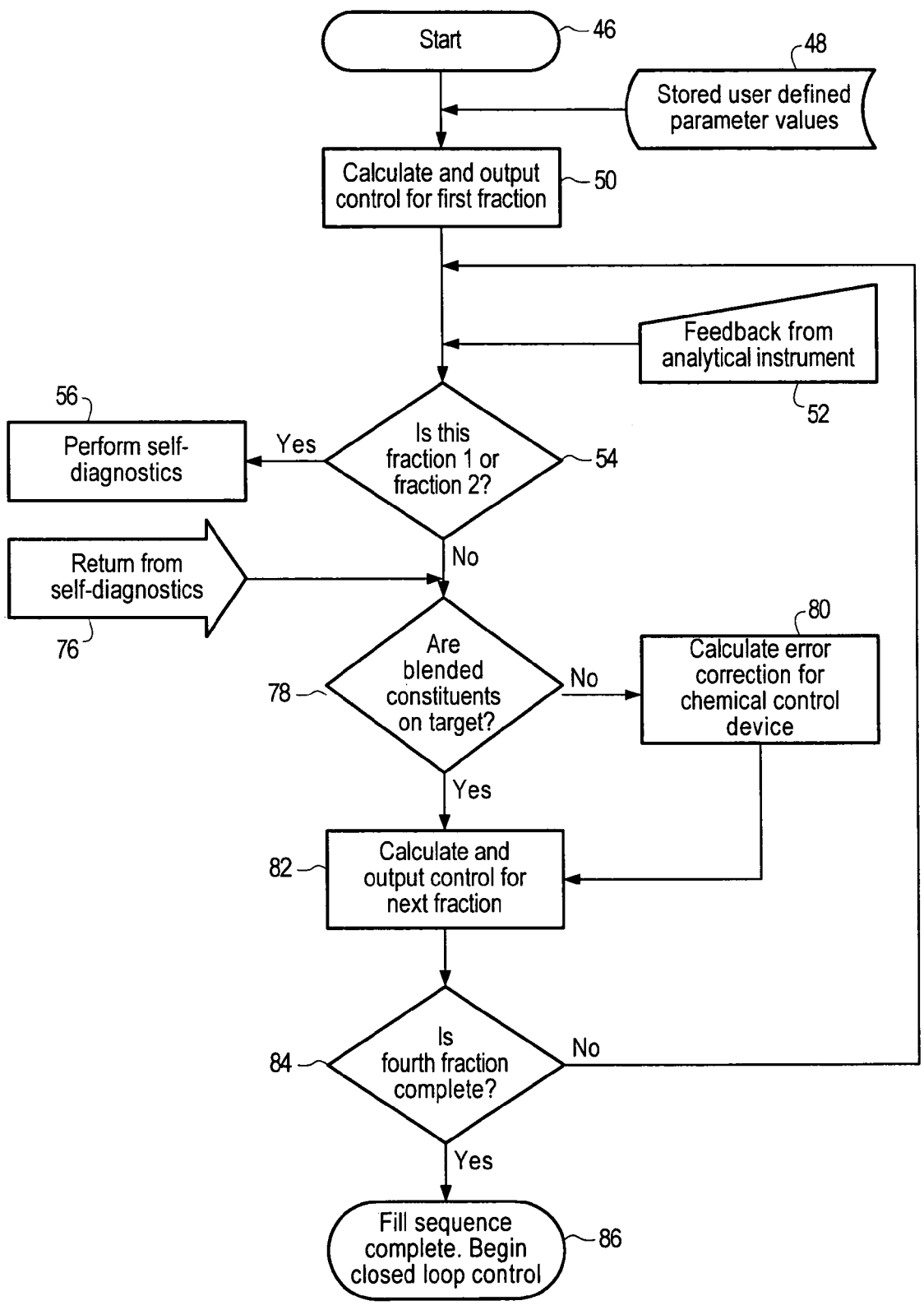
FIGS. 4 and 5 are flow charts of another fractional fill mixing method.
Figure 5:
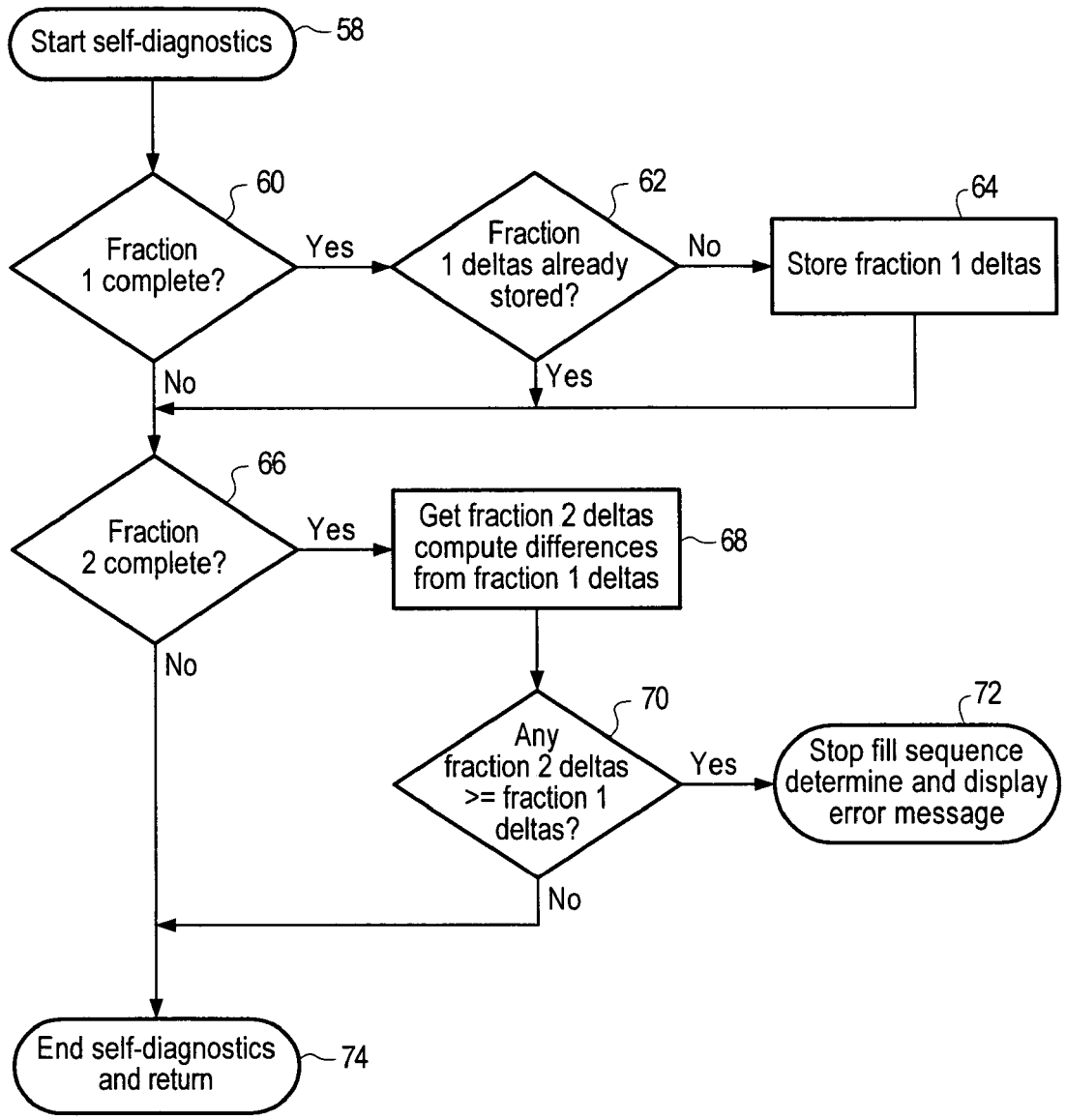

With reference to FIGS. 4 and 5, there is shown another embodiment of the present invention which includes a fractional fill method incorporating self diagnostics. The method of this embodiment begins at 46 as best shown in FIG. 4. Stored user-defined parameter values are gathered by the controller 12 for subsequent use within the fractional fill method (48). These user-defined parameter values may include the number of fractional fill sequences to be performed, and the relative fill volume percentages. The user-defined parameter values may also include information such as concentration information regarding the bulk chemicals to be added to the admixture.

The method calculates the proper volumes of chemicals to be added to the admixture for the first fractional fill sequence (50). Those chemicals are then added to the admixture. Feedback from an analytical instrument, such as analytical instrument 14, provides the quantity, expressed in a percent by weight, or percent by volume concentration or other, of each of the chemicals in the admixture stored in the container 12 for the first fractional fill sequence (52). A decision is then made whether the method is within the first fractional fill sequence or the second fractional fill sequence (54). If this is true, self-diagnostics are then performed (56).

As best seen in FIG. 5, self-diagnostics begin at 58. The method of the example then evaluates whether or not the first fractional fill sequence was complete (60). If it was complete, the determination is made whether or not the first fractional sequence delta values are already stored (62). The first fractional fill sequence delta values represent the difference between the theoretical volumes of the chemicals that should be dispensed into the admixture compared to a revised volume for a chemical that may be admitted to the admixture due to a variance detected by the analytical instrument 14.

If those fractional filled delta values are not already stored, the controller 26 stores those fractional delta values (64). The method as executed by controller 26 then determines whether the second fractional fill sequence is complete (66). If not, the self-diagnostics method is terminated (74) and the method then returns to the method as shown in FIG. 4 at 76. If the second fractional fill sequence has been completed, then the second fractional fill delta values are captured and the differences between the first fractional fill delta values and the second fractional filled delta values are then calculated (68).

According to this embodiment, if any of the second fractional fill delta values are greater than or equal to the first fractional fill delta values (70), then the filling sequence is stopped and an error message is displayed (72). This result occurs when the fractional fill method is unable to correct any deviation in chemical concentration or quantity between the first fractional fill sequence and the second fractional fill sequence. In other words, if a deviation or delta is discovered in any of the chemicals for the first fractional fill and then a corrective partial fill of chemicals is added in the second fractional fill sequence, it is assumed that quantity of chemicals will be more accurate than the first fractional fill. If it is discovered that the deviation or delta of any of the chemicals did not decrease between the first fractional fill sequence and the second fractional fill sequence, the fractional fill method is then deemed to be unable to complete the creation of the desired batch.

Referring back to decision box 70 on FIG. 5, if any of the second fractional fill delta values are not greater than or equal to the first fractional fill delta values then the self-diagnostics method terminates (74) and returns to the fractional fill method as shown on FIG. 4 at 76.

Referring now to FIG. 4, the method evaluates whether the blended constituents are on target (78). In other words, the analytical instrument 14 analyzes the quantity, percent by weight, percent by volume, concentration or other property of the chemicals depending on the example in the admixture. If they are not on target, an error correction is then calculated for the subsequent fractional fill sequence as described previously (80). The error correction is then in the calculation of the amount of each chemical used for the subsequent fractional fill (82). If the blended constituents are on target, the volumes for each chemical are then calculated for the subsequent fractional fill sequence without having any error correction applied (82).

The method of the present embodiment, as shown in FIG. 4, then determines if the fourth fraction is complete (84). It should be understood that if the stored user-defined parameter values call for less or more than four fractional fill sequences, the method evaluates whether all of the desired fractional fill sequences have been completed.

If the fourth or final fractional fill has been completed, then the method of the present embodiment terminates (86) where closed loop control of the admixture in container 12 may begin. The closed loop control approach may be feedforward or feedback. The blending may occur via liquid flow controllers, metering pump, critical orifice or gravimetric such as preweigh or a continuous drip method as examples. It should be understood that prior to determining the quantity of chemicals in the mixture at any of the steps in the above-described method, the homogeneity of the composition may be determined and such measurements may be delayed until the composition is determined to be homogeneous.

In another embodiment, collected analytical data may be used to control the amount of each chemical added in a feedback loop. For each chemical of the composition, a target quantity is predetermined by the user. As the composition is prepared, the analyzer determines the actual quantity of each chemical of the composition. The error (E) is represented as the difference between the target quantity (R) and the measured quantity (B). If the error is larger than a predetermined set point, the controller takes appropriate action to modify the metering of the chemicals. In an embodiment, the controller determines how much to vary the quantity of each chemical to bring the batch composition within the targeted range. The change in quantity, can be determined based on the following equation:

$$quant = gain * error$$

The allowable error range and the gain parameter are preset for each chemical. This methodology may be used during a fractional filling method or during a continuous or point-of use blending method.

Reliability and accuracy of a blend may be improved by determining if a composition is homogeneously blended prior to performing calculations based on measured quantities of one or more chemicals. Generally data related to the quantity of one or more chemicals is collected from the analyzer over a period of time. The variation of the quantity of one or more of the chemicals over the period of time is measured. Through a variety of statistical techniques the collected data is analyzed to determine if the composition is homogeneous. In some embodiments, a numerical value, known herein as the "homogeneity of the composition" is determined. The homogeneity number is compared to a predetermined minimum value. If the homogeneity number is equal to or greater than the predetermined minimum, the composition is considered to be homogeneously blended.

Figure 6:
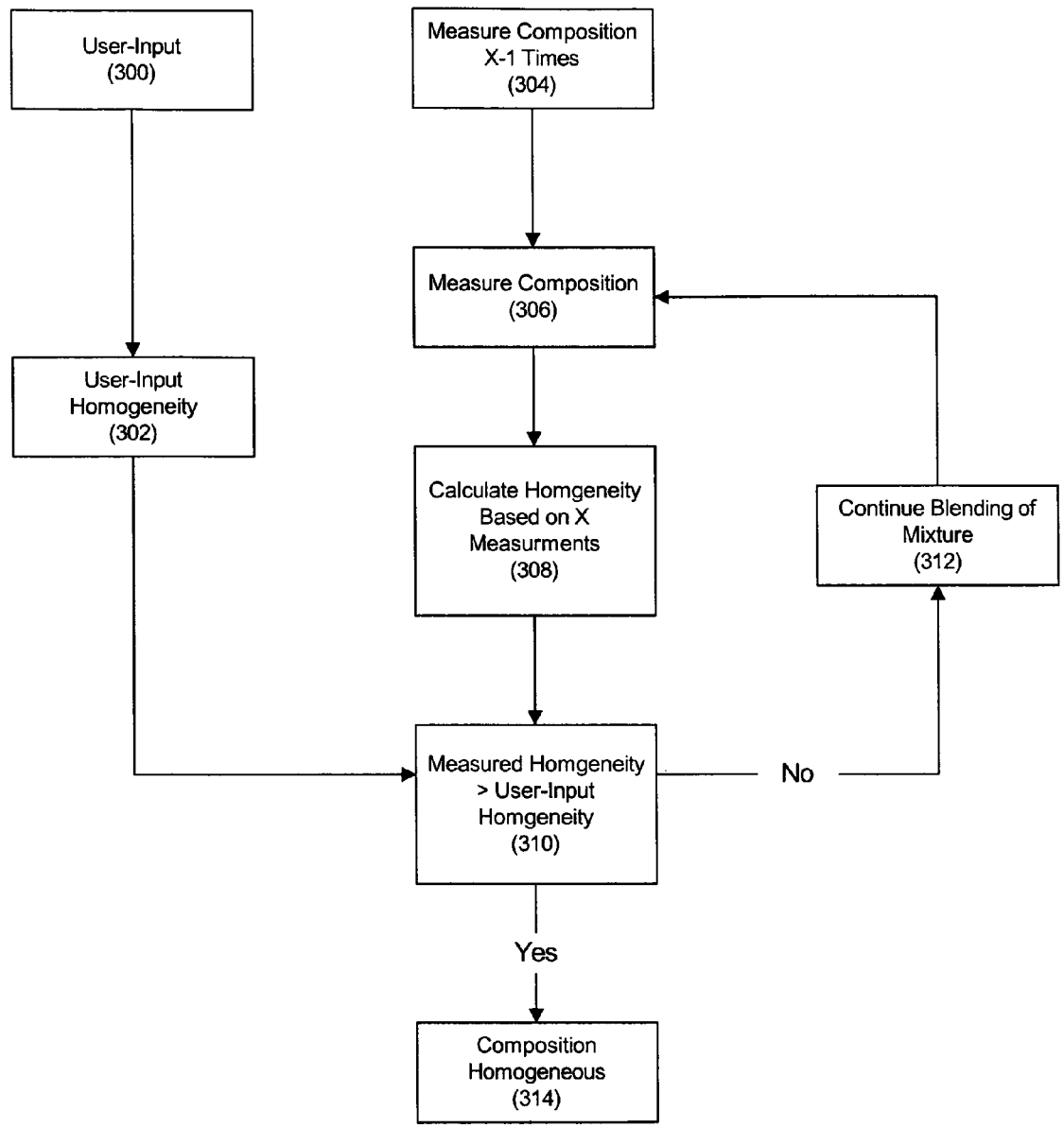
FIG. 6 depicts a flow chart of a homogeneity determination method.

FIG. 6 shows a flow chart showing a general method of determining the homogeneity of a composition. The method generally begins at (300) where the user-defined parameters are inputted. User parameters may include information related to the desired degree of homogeneity, the chemicals to be analyzed, the time between measurements, and the number of measurements to be taken before determining the homogeneity. In alternate embodiments, some or all of the parameters may be predetermined and pre-programmed into a controller. Based on the desired degree of homogeneity, a homogeneity number may be determined (302). This user based homogeneity number is used to determine if the homogeneity of a composition matches the user-defined (or pre-defined) specifications.

In one embodiment, the homogeneity of a solution may be determined using a statistical analysis of the quantities of one or more chemicals as they vary over a period of time. The period of time and the number of measurements taken over the period of time may be predetermined by the manufacturer or selected by the user. In some embodiments, at least 10, at least 20, at least 30, at least 50 or at least 100 measurements may be taken for the homogeneity analysis. Measurements may be taken at intervals ranging from 0.1 seconds to 10 seconds apart. In some embodiments, measurements may be taken at 1-second intervals. As shown at (304) the quantity of one or more chemicals is measured at least X−1 times, where X represents the number of measurements based on the parameters for a homogeneity analysis. After the last measurement is taken (306), i.e., the measurement corresponding to the Xth measurement, the homogeneity of the composition is calculated using the X measurements (308). The resulting measured homogeneity is compared to the user based homogeneity number (310). If the measured homogeneity number is greater than or equal to the user-based homogeneity number, the composition is considered to be homogeneous (312). If the number is less than the user based homogeneity number, blending of the composition is continued and a new homogeneity number is calculated after the next measurement is taken. The new homogeneity number is based on the last X number of measurements taken.

The homogeneity of a composition may be determined based on one chemical of the composition, or on multiple chemicals of the composition. In one embodiment, the homogeneity number for each of the chemicals may be determined and compared to a user homogeneity number. If the calculated homogeneity number for each chemical is equal to or greater than the user homogeneity number entered for each chemical, then the composition may be accepted as homogeneously mixed. In some embodiments, a user homogeneity number may be entered for each chemical. Alternatively, a single user homogeneity number may be entered. To determine if a composition is homogeneous, each of the chemicals will have to have a homogeneity number that is equal to or greater than the single user homogeneity number.

In one embodiment, the average variation of the quantity of one or more chemicals is related to the average deviation of the quantity of one or more chemicals with respect to an average quantity of the chemicals in the composition. Such an average may be calculated using a Mahalanobis Distance technique. Generally, an average deviation may be determined by collecting a predetermined number of quantity measurements for one or more chemicals in the composition at predetermined time intervals. An average quantity of each of the measured chemicals may be determined from the measurements. For each measured quantity of the chemicals, the standard deviation of the measured quantity with respect to the average quantity for the chemical is determined. The resulting plurality of standard deviations may be averaged to give an average standard deviation of one or more of the chemicals. The homogeneity of the composition may then be calculated from the average standard deviation.

In some embodiments, the homogeneity of a composition may be determined based on the measured quantity of a single chemical. The average quantity ($\mu$) of a single chemical is determined from:

$$\mu = \sum_{i=1}^{N} x_i / N$$

where N is the number of measurements and where $x_i$ represents the ith quantity measurement. For each measurement, $x_i$, the deviation ($\sigma_i$) of the measurement from the average quantity ($\mu$) is determined and an average deviation ($\sigma_R$) is calculated. The formula representing the average deviation is, therefore:

$$\sigma_R = \sqrt{1/N * \sum_{i=1}^{N} (x_i - \mu)^2}$$

The homogeneity number may then be determined based on a user-defined or manufacturer defined tolerance. The tolerance represents the allowed statistical variation in the quantity of the chemical of the composition. In an embodiment, the tolerance is given as a percent value. The higher the percentage the lower the allowed statistical variation. Generally, for a normal distribution, the probability, P, of a data point falling within a specified number of standard deviations n, of the mean is given in Table 2 below.

TABLE 2

| P | $n_P$ |
|---|---|
| 90% | 1.64485 |
| 95% | 1.95996 |
| 99% | 2.5783 |

The tolerance of the homogeneity measurement may be entered as a percentage by a user or may be predefined by the manufacturer. The tolerance of the homogeneity of the composition may be related to the np value in Table 2 above. Using the obtained tolerance, the measured homogeneity of a chemical in the composition may be calculated using the formula:

$$\xi_P = 1 - n_P * \sigma_R$$

where $\xi_P$ is the homogeneity number at a tolerance of P, where $n_P$ is as defined in Table 2, and where $\sigma_R$ is calculated above. The measured homogeneity number of the chemical may be compared to a measured homogeneity number entered by the user or predefined by the manufacturer. If the measured homogeneity number is equal to or greater than the user homogeneity number, the composition may be accepted as homogenously mixed.

Similar equations may be used for determining the homogeneity of multiple chemicals. In one embodiment, a composition homogeneity number may be determined as a function of the average standard deviation of two or more chemicals in the composition. As described above, $\sigma_R$, for each chemical may be determined. Using the average standard deviation of each chemical, an average standard deviation of the composition may be determined using the formula:

$$\sigma_{COM} = \sqrt{\sum_{i=1}^{m} \sigma_{R,m}^2}$$

where $\sigma_{COM}$ is the average standard deviation of the composition, m represents the number of chemicals being analyzed, and $\sigma_{R,m}$ represents the average standard deviation of chemical "m." The composition homogeneity number may be determined using the formula:

$$\xi_P = 1 - n_P * \sigma_{COM}$$

The measured composition homogeneity number may be compared to a measured homogeneity number entered by the user or predefined by the manufacturer. If the measured homogeneity number is equal to or greater than the user homogeneity number, the composition may be accepted as homogenously mixed.

The use of standard deviations to determine the homogeneity of a composition relies, in part on the variation of the quantity of one or more chemicals with respect to an average measured quantity of one or more of the chemicals. In an alternate embodiment, the homogeneity of a composition may be determined by measuring the variation of the quantity of one or more chemicals over time.

In some embodiments, the homogeneity of a composition may be determined based on the change in the measured quantity of a single chemical over a period of time. In an embodiment, measurements of at least one chemical are made at predetermined time intervals. For each measurement, $x_i$, the change ($\delta_i$) of the measurement of the quantity at the beginning of the time and at the end of the time period is determined and divided by the time interval, the general formula being:

$$\delta_i = (x_{i-1} - x_i)/(t_{i-1} - t_i)$$

An average measured change in the quantity of a chemical ($\delta_R$) may then be calculated using the following equation:

$$\delta_R = 1/N * \sum_{i=1}^{N} \delta_i$$

where N is the number of measurements and where $\delta_i$ represents the ith quantity measurement.

The homogeneity number may then be determined based on a user-defined or manufacturer defined tolerance, as described above. Using the obtained tolerance, the measured homogeneity of a chemical in the composition may be compared to a measured homogeneity number entered by the user or predefined by the manufacturer. If the measured homogeneity number is equal to or greater than the user homogeneity number, the composition may be accepted as homogenously mixed.

Similar equations may be used for determining the homogeneity of multiple chemicals. In one embodiment, a composition homogeneity number may be determined as a function of the change in the measured quantity of two or more chemicals in a composition over a period of time. As described above, $\delta_R$, for each chemical may be determined and calculated. Using the average measured change in the quantity of each chemical, an average measured change in the quantity of the measured chemicals of a composition may be determined using the formula:

$$\delta_{COM} = \sqrt{\sum_{i=1}^{m} \delta_{R,m}^2}$$

where $\delta_{COM}$ is the average measured change in quantity of the measured chemicals of the composition, m represents the number of chemicals being analyzed, and $\delta_{R,m}$ represents the average measured change in quantity of chemical "m." The measured composition homogeneity number may be compared to a measured homogeneity number entered by the user or predefined by the manufacturer. If the measured homogeneity number is equal to or greater than the user homogeneity number, the composition may be accepted as homogenously mixed.

By analyzing the rate of change in a set of measurements (e.g., as described above), it is possible to determine whether or not a system has sufficiently converged to equilibrium such that one may obtain accurate measurements about its state. Furthermore, by evaluating higher order derivatives of the dataset, one may also estimate the final value of a changing system by extrapolating where the first derivative will become near-zero; or the point at which the system is no longer changing appreciably, and thus would be sufficiently equilibrated. In this manner, the quantity of one or more of the chemicals of a composition, when the composition is homogeneously mixed, may be determined prior to the composition reaching homogeneity.

Any unbiased indicator of the derivative of a measurement signal may be used to detect trending. These could be constants obtained from linear or curvilinear regression, or any method that produces an unbiased indicator. Analysis of the change in quantity for previous mixing of the composition may allow the derivation of a model of the manner in which the quantity of one or more of the chemicals changes during mixing. Comparison of the quantity measurements obtained during subsequent mixing of the chemicals to the model allows an assessment of the progress of the mixing in the subsequent composition. In one embodiment, the comparison of actual measurements to the model may allow a user to determine if homogeneity has been reached by assessing where the measurement fall within the model. For example, if the measurements are similar to measurements in a non-homogeneous region of the model, it may be assumed that the composition is not homogeneously mixed.

Considering now the fractional fill mixing apparatus of the disclosed embodiment in greater detail with reference to FIG. 1, a process pump 88 may be used to re-circulate the chemicals in container 12 to achieve homogeneity of the mixture. In some embodiments, process pump 88 may be an air operated process pump. Process pump 88 may be air operated to minimize the risk of any explosions or fires since flammable compounds and chemicals may be flowing through pump 88. Process pump 88 is coupled in fluid communication with container 12 via a conduit 90. A maintenance drain 92 may be coupled to conduit 90 to allow draining operations from the conduit 90.

A filter 96 is disposed in-line with pump 88 within the recirculation line of the fractal fill mixing apparatus 10, and a conduit 98 connects pump 88 to filter 96. A three-way valve 102 (e.g., an air operated valve) is positioned in conduit 98 between pump 88 and filter 96 to permit additional fluid (e.g., de-ionized water) to enter conduit 98 for the purpose of flushing out the fractional fill mixing apparatus 10. A second three-way valve 100 is also positioned in conduit 98 to permit draining between batches. Gas may also be introduced into conduit 98 through valve 104. In some embodiments, pressurized gas (e.g., nitrogen, air, argon, or helium) may be introduced into the fractional fill mixing apparatus 10 through valve 104. Three-way valve 106 is connected in fluid communication down stream of the filter 96 to selectively permit chemicals stored in container 12 to be delivered via a conduit 124 to a process tool and/or container (not shown) for utilization of the batch or to be recirculated back to the manifold via conduit 120. A conduit 108 connects the filter 96 in fluid communication with the valve 106, and an analytical pump 112. In some embodiments, pump 112 may be activated to draw at least a portion of the fluid flowing through conduit 108 into analyzer 14. A conduit 114 is connected in fluid communication between the conduit 108 and the pump 112 to allow fluid to be drawn from conduit 108 to pump 112.

The analyzer or analytical instrument 14 is connected in fluid communication with the output of the pump 112 via a conduit 116. The analyzer 14 may be a high precision chemical concentration monitor. An example of such a device is the SC-1 monitor manufactured by HORIBA and marketed as model no. CS-131. Other monitors include, but are not limited to, HORIBA model No. CM-210 for DHF compositions, HORIBA model No. CS-137 for BHF compositions, HORIBA model No. CS-150 for SPM compositions, and HORIBA model No. CS-152 for SC2 compositions. The analytical instrument or analyzer 14 is connected in fluid communications with a by-pass re-circulation conduit 120 via a conduit 118, so that the mixture is re-circulated through both the analyzer 14 and the by-pass conduit 120 until the delivery valve 106 is actuated to deliver the batch to a process tool and/or container via the conduit 124. In the embodiment depicted, the mixture is re-circulated to container 12 via manifold 24.

Manifold 24 is connected in fluid communication to the chemical supply control device generally indicated at 16 via three conduits 132, 134 and 136. Chemical supply control device 16 includes three independent chemical control devices 126, 128 and 130. Each control device is capable of accurately dispensing chemicals from a bulk supply (not shown) into the manifold 24. Chemical control devices 126, 128 and 130 are each independently fed from chemical supply tubes 18, 20, and 22, respectively. Manifold 24 is connected in fluid communication with container 12 via conduit 122.

Chemical control devices 126, 128, 130 may be any number of control devices known in the art, including, but not limited to, pumps, gravity feed systems, flow controllers, etc. Examples of metering pumps that could be used include pumps that are driven by dry reed contact closures and are characterized by CC (volume) per stroke such as contact closure cycle. Further details regarding chemical control devices may be found in U.S. patent application Ser. No. 11/177,930.

Figure 7:
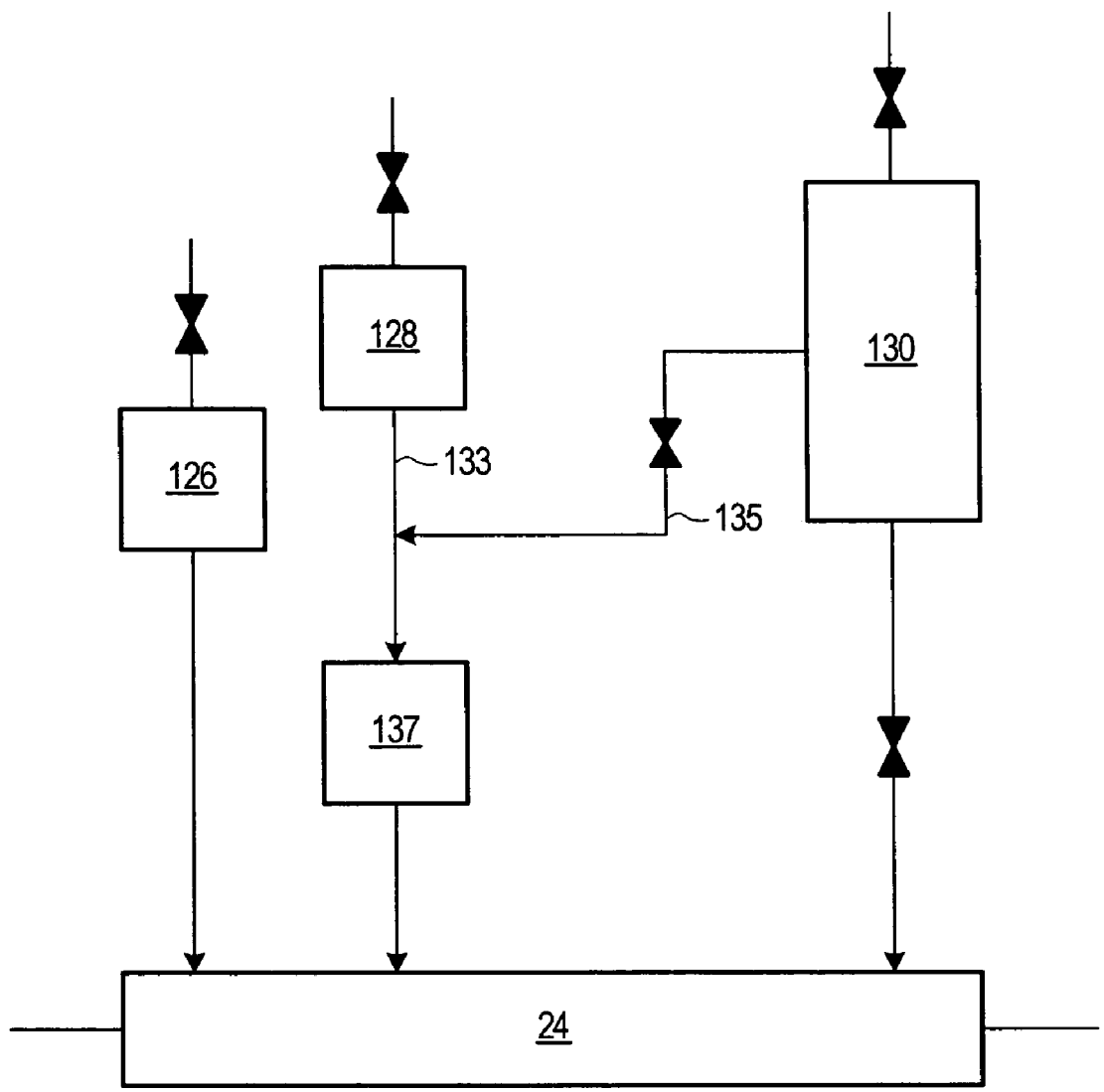
FIG. 7 depicts a schematic view of an embodiment of a plurality of chemical dispensing devices.

FIG. 7 depicts a detailed view of an embodiment of chemical control devices 126, 128 and 130. In this embodiment, the ingredient control devices include two liquid flow controllers (126 and 128) for ingredients 1 and 2. Ingredient 3, in this embodiment, is deionized water, but could also be any other ingredient suitable for formulating the desired composition. Ingredient 3 is dispensed gravimetrically from tank 130. Tank 130 is kept filled with at least some water. In some embodiments, pre-blending of one or more chemicals may be desired before dispensing the chemicals into container 12. For example, it is known that HF is more difficult to blend homogenously with water than other chemicals. By pre-blending HF with water prior to dispensing into container 12, the homogeneity of the composition may be reached in less time than if no pre-blending was performed. In other embodiments, the bulk chemical supply may be a concentrated source of a chemical. Pre-blending of a chemical may allow the concentration of the chemical entering the container to be lowered, allowing more accurate measurements of the dispensing of the chemical.

In one embodiment, pre-blending of the composition may be accomplished by adding an additional dispense line 135 to the ingredient control devices. In the depicted embodiment, water from chemical dispense device 130 may be added via conduit 135 to conduit 133. Conduit 133 is used to dispense one of the chemical used to form the mixture. The combination of chemical from chemical control device 128 and water from chemical control device 130 may be passed to a mixer 137, where pre-blending of the chemical and water may be accomplished. The pre-blended chemical may be passed to manifold 24 and forwarded to container 12 for further blending. It should be understood that pre-blending may be accomplished between any number of chemicals is not intended to be restricted to blending of chemicals with solvent. Additionally, it should be understood that mixer 137 is not required. Pre-blending may occur by simply having the dispense conduits of two or more chemicals converge upstream of manifold 24.

The accuracy of the dispensing of the chemicals for the mixture relies, in part, in accurate zero point control of the chemical control devices. Zero point control refers to placing the controller in a state in which no flow of chemical is detected from the control device. During use, a controller may be given a zero point control signal. In response to a zero point control signal, the chemical control device may alter its configuration to halt or inhibit flow of the chemical through the control device. In some embodiments, a chemical control device may not properly close, allowing some chemical flow through the device, even though the zero point control signal was received. In such a situation, the actual amount of chemical flowing through the chemical control device may be greater than the amount of chemical that is assumed to be flowing through the control device.

Figure 8:
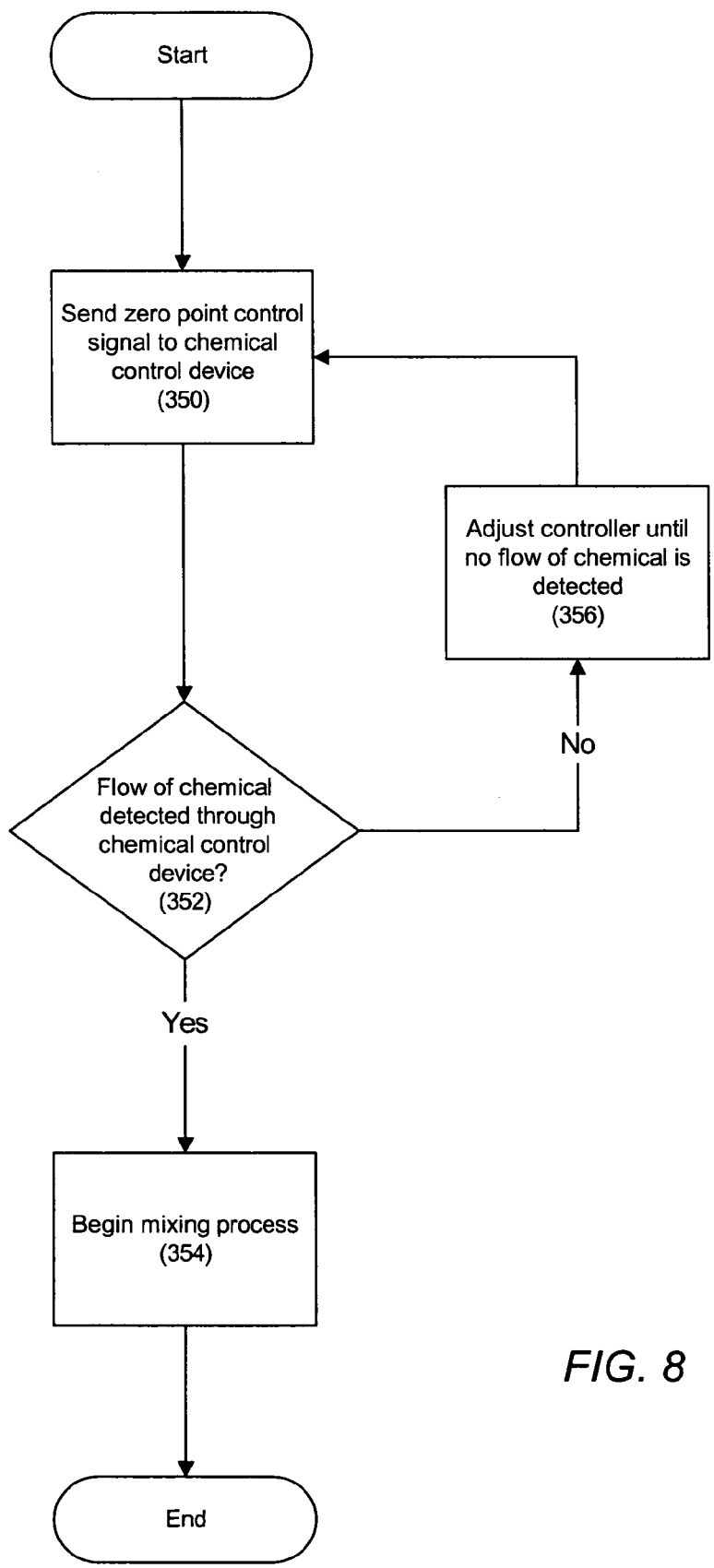
FIG. 8 depicts a flow chart of a zero point control method.

FIG. 8 depicts a flow chart of a method of zero point flow control for a chemical control device. The method begins at (350), when a zero point control signal is sent to one or more chemical control devices. Each of the chemical control devices, upon receipt of the zero point control signal, will adjust the internal configuration to stop or inhibit flow of the chemical. In some embodiments, the adjustment may include altering the position of a valve to stop or inhibit the flow of fluid. In other embodiments, one or more pumps associated with the chemical control device may be stopped.

After the chemical control device has received the control signal, the flow of chemicals from the one or more chemical control devices is monitored (352). If the chemical control devices have accurately reset into a zero state, the monitored flow of chemical through the chemical control device should be substantially zero. Under such situations, the device may be certified as being properly reset to a zero state and the mixing process begun (354).

If a detectable amount of chemical is flowing through one or more of the chemical control devices, the controller may send a warning indication to a user that the controllers are not functioning properly. In response, the chemical control device may be adjusted such that flow of the chemical through the chemical control device may be inhibited (356). One or more reset signals may also be sent to one or more of the chemical control devices. The reset signals may cause one or more of the chemical control devices to reset into a default position. The default position may be a position which inhibits flow of the chemical. Alternatively, the indication of improper functioning of one or more chemical control devices to the user, may prompt the user to perform maintenance on one or more of the chemical control devices. Such maintenance may include manually adjusting the position of one or more valves such that the zero state of the chemical control device inhibits the flow of fluid through the device. After maintenance and adjustment of the chemical control device has been performed, the zero state of the chemical control device may be retested to ensure proper functioning. If the retesting of the device shows proper operation of the device, the device may be certified as being properly reset to a zero state and the mixing process begun (354).

In operation and with reference to FIG. 1, the controller 26 receives a series of composition parameters that describe the desired quantities of each chemical to be blended together in container 12. Controller 26 then performs a first fractional fill sequence as previously described. Controller 26 sends commands to the chemical supply control device 16 to dispense the proper amount of chemicals for the first fractional fill. When this occurs, chemical control devices 126, 128 and 130 begin accurately dispensing chemicals from their respective bulk chemical supplies (not shown) via conduits 18, 20 and 22, respectively. Each chemical is then dispensed into manifold 24 through conduits 132, 134, and 136. The chemicals are partially mixed in manifold 24 and then supplied to container 12 through conduit 122. After the first fractional fill sequence is complete, the analyzer 14 is enabled to measure the quantity of each of the chemical constituents in the mixture formed in container 12.

To accomplish this, pump 88 is activated to re-circulate the mixture from the container 12, which causes the mixture stored in container 12 to flow through the conduits 90 and 98 through the filter 96 and through the conduit 108. During this operation, the maintenance drain valve 92 and chemical delivery valve 106 are closed. Three-way valves 100, 102 and 104 are set in a position to allow free flow of fluid through conduit 98, while inhibiting flow of other fluids into conduit 98. The mixture from container 12 then continues to flow through the by-pass conduit 120 through the manifold 24 and back into the container 12. In this regard, the mixture stored in container 12 is circulated through the various conduits to mix the mixture to create a more homogeneous mixture before the analytical instrument 14 measures its concentration. The analytical pump 112 is then enabled to pump some of the admixture from the conduit 108 through the conduit 114, through the pump 112, and through the analytical instrument 14 where the quantity of chemicals in the mixture may be measured. The mixture then exits the analytical instrument 14 via the conduit 118 to join the mixture flowing through conduit 120.

For subsequent fractional fill sequences, the same general method as just described is performed again. In the present example, before subsequent fractional fill sequences are performed, the process pump 88 and analytical pump 112 are both disabled, although for other applications they may not be disabled. Subsequent to the completion of all the fractional fill sequences or at other times, the bath temperature controller 170 may be enabled to control the heater 150 to heat the mixture in container 12 to a predetermined temperature. This may be required for some mixtures for subsequent use in a manufacturing process or other process or purpose.

After all of the fractional fill sequences are complete, it may be desired for some applications to transfer the mixture stored in the container 12 to a process tool and/or container for subsequent use. That may be accomplished by first ensuring that the maintenance drain 92 is closed. Three-way valves 100, 102 and 104 are set in a position to allow free flow of fluid through conduit 98, while inhibiting flow of other fluids into conduit 98. For dispensing of the composition, the valve 106 is now positioned to allow flow of the composition out of the mixing system and inhibits recirculation of the composition through conduit 120. Process pump 88 is then enabled to pump the composition from container 12 through the conduit 90, the pump 88, the conduit 98, the filter 96 and through conduit 108. Because valve 106 is now open, the composition then flows through valve 106 and through the conduit 124 where it is delivered to the process tool, container, or other destination.

A reclaim drain three-way valve 140 is disposed between conduits, 138 and 142, so that when reclaimed drain valve 140 is open, recycled composition may be reclaimed into container 12 through conduits 138, 142, and through valve 140. It should be noted that in all other operations of the fractional fill mixing system 10, reclaim drain valve 140 is normally closed. A Flush Drain cycle may be used which includes: opening drain valve 100 and opening a fluid flush valve 102 and running the process pump 88. This will result in simultaneously draining the container and flushing the entire system including the manifold 24 and analyzer 14 with a cleaning fluid (e.g., water). This state remains for a designated parameter time. Turning off flush valve 102 completes the Flush Drain cycle. Nitrogen or some other inert gas (e.g., helium, argon, etc.) is introduced to force the container and associated plumbing to be drained of the cleaning fluid. The drain process continues until the container reaches a pre-determined low level of fluid. A system error may be indicated if a predetermined maximum drain time is exceeded. Drain valve 100 and gas valve 104 are closed after the process is completed. This would complete a Flush Drain Cycle and the apparatus would be ready for one or more fill cycles. Several fill cycles may be used to fill container 12. The intent of separating the fill cycles is to achieve a full container with the desired blended chemistry as soon as possible. The fractions are variable that can be adjusted to optimize the time to blend ready.

In operation, controller 26 communicates to the bath temperature controller 170 through a serial communications line 160 (e.g., under the RS-485 protocol). Likewise, controller 26 may also communicate to the chemical supply control device 16 and its individual chemical control devices 126, 128 and 130 through communication line 188 (e.g., a digital serial line or through an analog signal source). Further details regarding the controller and electronic interfaces may be found in U.S. Published Patent Application 2006/0009875 published Jan. 12, 2006 and U.S. patent application Ser. No. 11/177,930.

Figure 9:
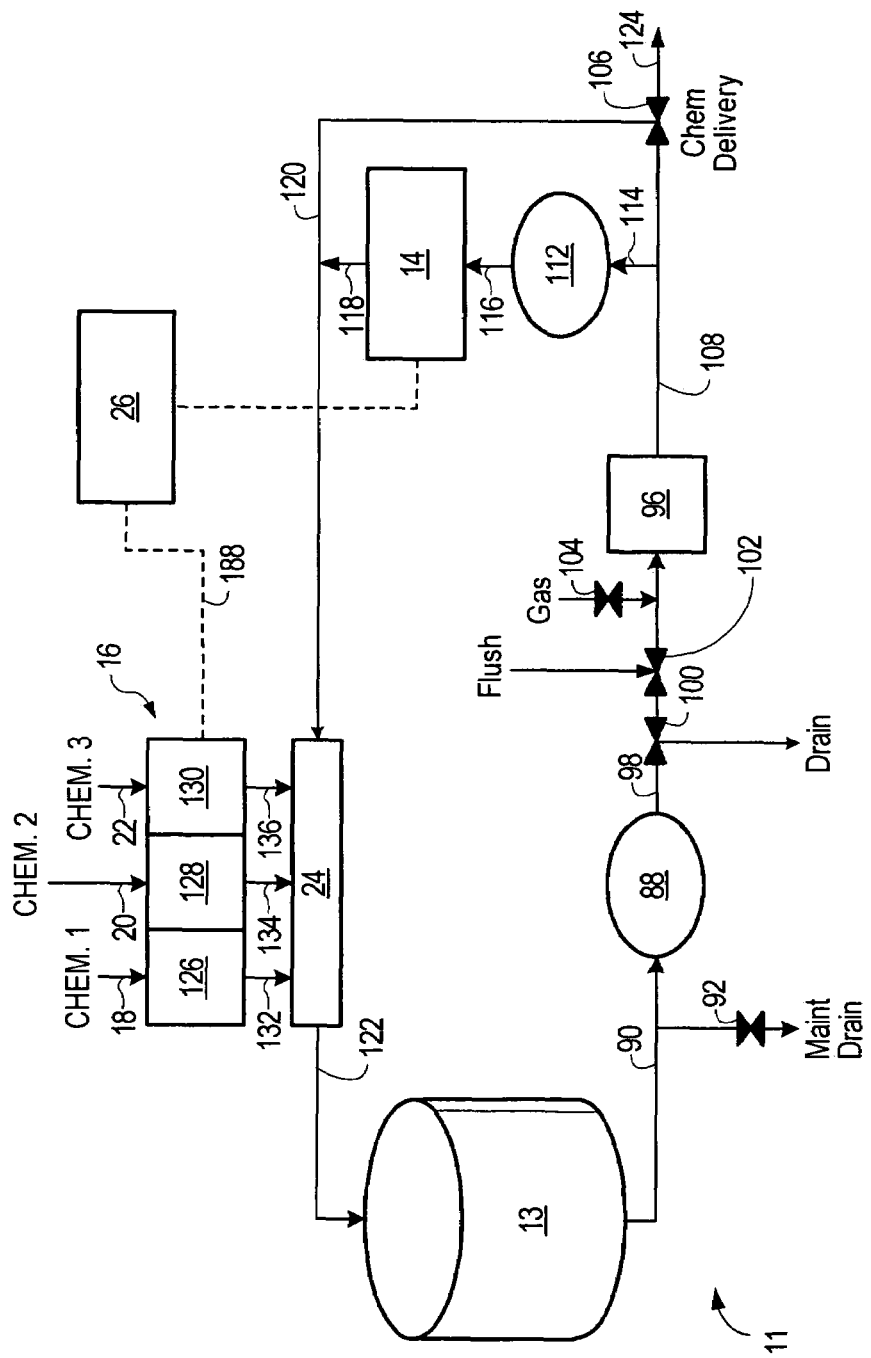
FIG. 9 is a schematic view of a point of use chemical mixing system.

FIG. 9 depicts a schematic diagram of a system for point of use chemical mixing of chemicals. Referring now to the drawings and, more particularly, to FIG. 9, there is shown a point of use mixing apparatus or system 11, which is used to mix two or more chemicals in a mixing area 13. An analyzer or analytical instrument 14 is configured to measure the quantities of each chemical flowing from the mixing area. A chemical supply control device shown generally at 16, controllably dispenses two or more chemicals into the mixing area 13. The chemical supply control device 16 dispenses chemicals through a plurality of chemical supply inlets, as has been previously discussed. Each chemical supply inlet is connected in fluid communication with a plurality of chemical supplies (not shown). A manifold 24 receives the plurality of chemicals from chemical supply control devices. The chemicals then flow from manifold 24 to the mixing area 13. The chemicals are blended and passed from the mixing area for analysis and eventual dispensing. It should be understood that a manifold differs from a container or tank. A manifold is configured to receive chemicals from one or more chemical sources and transmit the chemicals to an attached conduit. Chemicals have little or no residence time in the manifold and are rapidly transferred to the conduit.

Considering now the point of use chemical mixing system of the disclosed embodiment in greater detail with reference to FIG. 9, a process pump 88 may be used to re-circulate the chemicals through the system to achieve homogeneity of the mixture. In some embodiments, process pump 88 may be an air operated process pump. Process pump 88 may be air operated to minimize the risk of any explosions or fires since flammable compounds and chemicals may be flowing through pump 88. Process pump 88 is coupled in fluid communication with mixer 13 via a conduit 90. A maintenance drain 92 may be coupled to conduit 90 to allow draining operations from the conduit 90.

A filter 96 is disposed in-line with pump 88 within the recirculation line of the point of use mixing apparatus 11, and a conduit 98 connects pump 88 to filter 96. A three-way valve 102 (e.g., an air operated valve) is positioned in conduit 98 between pump 88 and filter 96 to permit additional fluid (e.g., de-ionized water) to enter conduit 98 for the purpose of flushing out the point of use mixing apparatus 10. A second three-way valve 100 is also positioned in conduit 98 to permit draining of the composition. Gas may also be introduced into conduit 98 through valve 104. In some embodiments, pressurized gas (e.g., nitrogen, air, argon, or helium) may be introduced into the fractional fill mixing apparatus 10 through valve 104.

Three-way valve 106 is connected in fluid communication downstream of the filter 96 to selectively permit the composition to be delivered via a conduit 124 to a process tool and/or container for utilization of the composition or to be recirculated back to manifold 24 via conduit 120. Recirculation to manifold 24 allows mixing of the composition with additional chemicals being introduced into the system. By recirculation the composition to the manifold, enhanced mixing may be achieved due to the mixing forces created by entry of the composition into the manifold. A conduit 108 connects the filter 96 in fluid communication with the valve 106, and an analytical pump 112. In some embodiments, pump 112 may be activated to draw at least a portion of the fluid flowing through conduit 108 into analyzer 14. A conduit 114 is connected in fluid communication between the conduit 108 and the pump 112 to allow fluid to be drawn from conduit 108 to pump 112.

The analyzer or analytical instrument 14 is connected in fluid communication with the output of the pump 112 via a conduit 116. The analyzer 14 may be a high precision chemical concentration monitor. An example of such a device is the SC-1 monitor manufactured by HORIBA and marketed as model No. CS-131. Other monitors include, but are not limited to, HORIBA model No. CM-210 for DHF compositions, HORIBA model No. CS-137 for BHF compositions, HORIBA model No. CS-150 for SPM compositions, and HORIBA model No. CS-152 for SC2 compositions. The analytical instrument or analyzer 14 is connected in fluid communications with a by-pass re-circulation conduit 120 via a conduit 118, so that the mixture is re-circulated through both the analyzer 14 and the by-pass conduit 120 until the delivery valve 106 is actuated to deliver the batch to a process tool and/or container via the conduit 124. In the embodiment depicted, the mixture is re-circulated to mixer 13 via manifold 24.

Manifold 24 is connected in fluid communication to the chemical supply control device generally indicated at 16 via three conduits 132, 134 and 136. Chemical supply control device 16 includes three independent chemical control devices 126, 128 and 130. Each control device is capable of accurately dispensing chemicals from a bulk supply (not shown) into the manifold 24. Chemical control devices 126, 128 and 130 are each independently fed from chemical supply tubes 18, 20, and 22, respectively. Manifold 24 is connected in fluid communication with container 12 via conduit 122. A pre-blending chemical dispensing system, as described with respect to FIG. 7, may also be used in a point-of-use blending system.

Chemical control devices 126, 128, 130 may be any number of control devices known in the art, including, but not limited to, pumps, gravity feed systems, flow controllers, etc. Examples of metering pumps that could be used include pumps that are driven by dry reed contact closures and are characterized by CC (volume) per stroke such as contact closure cycle. Further details regarding chemical control devices may be found in U.S. patent application Ser. No. 11/177,930.

Figure 10:
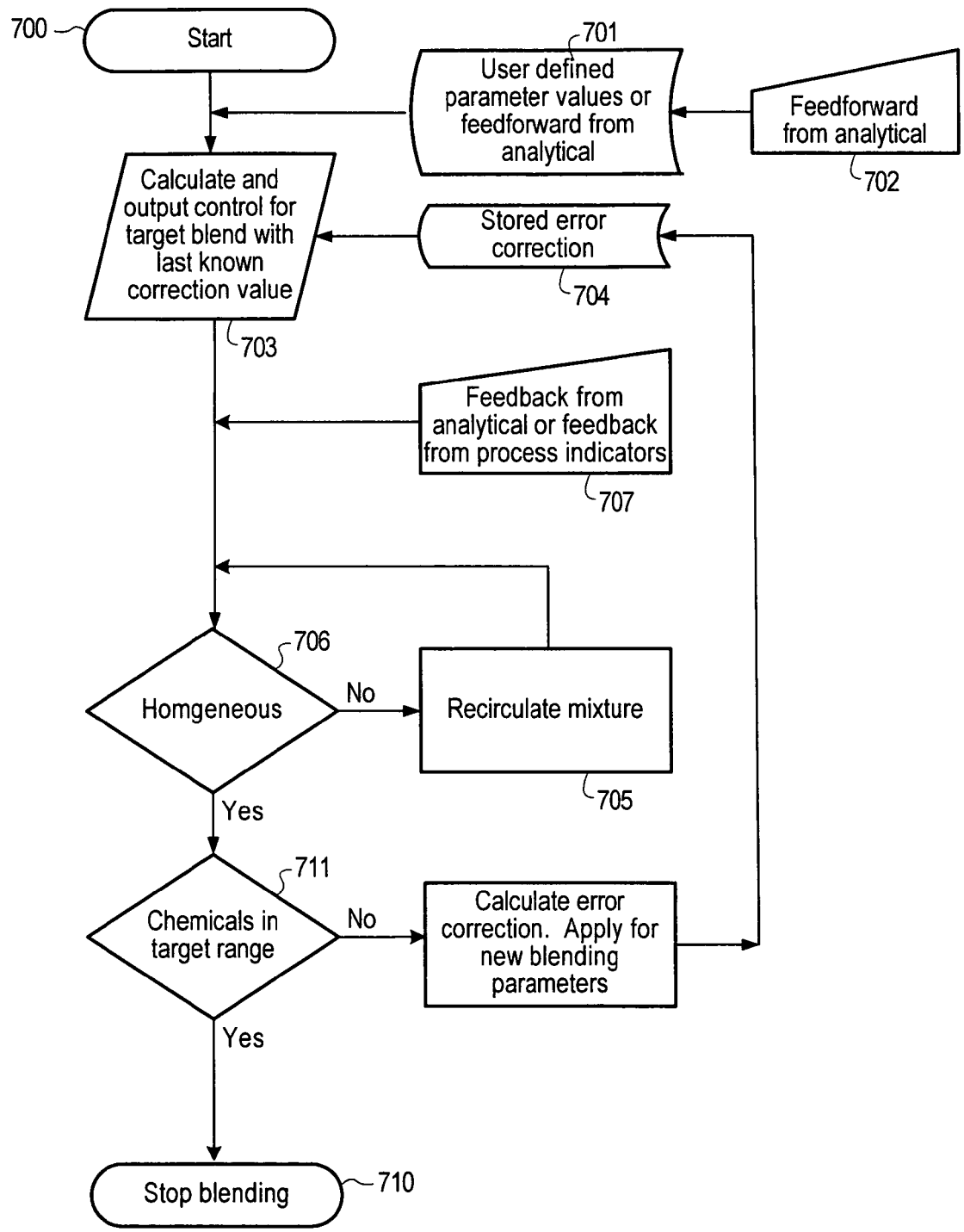
FIG. 10 is a flow chart of a general control method for mixing chemicals.

Referring now to FIG. 10, a single control algorithm may be applied by user selectable methods for either batch or point of use processing. Since the control action is the same, the method employed is situational and user dependent. The control algorithm provides the user with gain and dead band control so that the user can optimize the control action appropriate to the users' situation. The algorithm also contains a variable, which holds the error correction value for each chemical control device to be used for each blend sequence. This variable is updated, as required, based on the analytical feedback delta to desired blend, either in the continuous mode, or the periodic testing mode. A standard SISO control is applied to each chemical and a user-defined delay is applied between actions to allow time for the analytical to provide feedback and see the effect of each action upon the multi-variant chemicals. As the fluid level in the container becomes vanishing small the control and blending shrink to a small volume for mixing the desired blend. This allows a faster response time to provide process flexibility and tool versatility because blends can be provided at the point of use with the decision to make blend changes while the composition is in use.

Turning to FIG. 10, the process begins at 700. User defined parameters are initially collected by the controller (701). These parameters include the chemical ratios for each chemical of the composition. Alternatively, parameters for commonly used compositions may be preset into the controller, in which case the user selects which of the preset compositions are to be made. Also input initially is information collected by one or more analytical instruments (702) during previous chemical blends. Data collected by analytical instruments during previous chemical blends may be used to modify the control parameters for subsequent runs.

After the parameters have been obtained, the controller determines the appropriate dispensing quantity for each chemical of the composition to produce the desired composition. For batch processing the controller determines the amount of each chemical that is to be dispensed into a container, as discussed previously. For point of use processing, the flow rate of each chemical is calculated. The flow rate of each chemical may be calculated using a feed-forward algorithm based on the total flow rate desired, the supply composition and the target composition. Analytical measurements received during previous use of the mixing system may be used to provide error correction values.

In a feed forward algorithm, for a point of use mixing process, the total flow of the process stream is typically a user-selected parameter. The total flow of the process stream is the sum of the flow of each chemical being added to the mixing area, as represented by the equation:

TotalFlow=chem1Flow+chem2Flow+diwFlow

It should be noted that while the above equation is directed to a composition that includes two chemicals and deionized water, the same general equation would apply for more or less than three chemicals.

The mixing method next includes calculating the target quantity of one chemical based on the user supplied blending ratio and the supply concentration of the chemical (703). The target quantity of one chemical is referred to as chem1Targ, which is defined as (chem1Ratio·bulkChem1)÷(chem1Ratio+chem2Ratio+diwRatio). Where chem1Ratio and chem2Ratio and diwRatio represent the ratios of the volume to be filled for the first, second, and third chemical, respectively, for the current sequence. These values are either preset into the controller or are defined by the user at start-up of the process. BulkChem1 represents the supply concentration of the first chemical. The target quantity of the other chemicals are calculated using similar formulas where the numerator of the above equation is replaced with the ratio and concentration of the bulk chemical supply from the respective chemical being calculated. chem2Targ and diwTarg are also calculated as just described.

After determining the target quantity of each chemical, the flow rate of each chemical is determined using the following equations:

Chem1Flow=(chem1Targ/bulkChem1)*totalFlow

Chem2Flow=(chem2Targ/bulkChem2)*totalFlow

The above equations assume that the specific gravity of each chemical and the final composition is 1. If the specific gravity is not equal to one, the following equations are used:

Chem1Flow=(chem1Targ*totalFlow*sGravPosite)/(bulkChem1*sGravChem1)

Chem2Flow=(chem2Targ*totalFlow*sGravPosite)/(bulkChem1*sGravChem2)

where sGravPosite is the specific gravity of the blended composition stream. SgravChem1 and sGravChem2 are the specific gravity of chemical 1 and chemical 2, respectively. The total flow of the third chemical, in this case deionized water, is determined from the following equation.

DiwFlow=totalFlow−chem1Flow−chem2Flow

The flow rate may also be modified based on one or more correction values that have been stored based on previous use of the mixing system. The stored error correction values (704) may be used to modify the flow rates according to the following equations:

Chem1FlowCorrected=Chem1Flow*ErrorCorr1

Where ErrorCorr1 is an error correction value determined from the analytical results of the process. This value would be 1 if no error correction is needed. The value can be calculated from the equation:

ErrorCorr1=Chem1Targ/Chem1Measured

Where Chem1Measured is the amount of chemical 1 measured in the produced composition. A similar correction value can be determined and used for chemical 2.

In one embodiment, flow of each chemical of the composition is controlled by metering pumps. The metering pumps may be operated using voltage control to control the flow rate at which the chemical is supplied. The following equations may be used to determine a voltage applied to the metering pump to achieve the calculated flow rate.

chem1Dac=(chem1Flow/chem1RangeFS)*DAC_SIG_FS chem2Dac=(chem2Flow/chem2RangeFS)*DAC_SIG_FS diwDac=(diwFlow/diwRangeFS)*DAC_SIG_FS where chem1RangeFS, chem2RangeFS and diwRangeFS represent the maximum flow rate of the pump coupled to the respective chemical supply sources and DAC_SIG_FS represents the voltage applied to achieve the maximum flow rate.

After determining the process parameters, the chemical supply control devices are operated to begin producing a composition stream. The composition stream passes into an analyzer where the quantity of each chemical is determined. The composition is then checked for homogeneity (706). If the composition is not homogeneous, then the composition is placed into a recirculation mode (705). The composition is then recirculated until the composition is homogeneously blended.

After the composition has reached homogeneity, the analyzer determines the quantity of one or more chemicals of the composition. The analyzer provides analytical feedback (707) to the controller regarding the quantity of the chemicals in the composition. The controller also analyzes the collected data to determine if the chemicals are within a target range (711). In one embodiment, if the chemicals are not within the target range an error correction value, calculated as described above, is determined and stored. The error correction value may be used to alter the flow rate of each of the chemicals to bring the blended composition to the target formulation.

In another embodiment, the collected analytical data may be used to control the pumping parameters in a feedback loop. For each chemical of the composition, a target concentration is predetermined by the user. As the composition is prepared, the analyzer determines the actual concentration of each chemical of the composition. The error (E) is represented as the difference between the target concentration (R) and the measured concentration (B). If the error is larger than a predetermined set point, the controller takes appropriate action to modify the metering of the chemicals. In an embodiment, metering of the chemicals may be controlled by modifying the voltage applied to one or more metering pumps. The change in voltage, can be determined based on the following equation:

$$\Delta M = (100/PB) * (((\Delta t/T_R) * E_N) + \Delta E)$$

where $\Delta M$ is the change (increase or decrease) in the DAC voltage (scaled by chemRange/10 v); PB is the Proportional Band (classical definition); $T_R$ is the reset time (seconds); $\Delta t$ is the scan time (seconds); $E_N$ is the current error; and $\Delta E$ is the change in error since the last scan. The parameters PB and $T_R$ are preset for each chemical.

The cycle is then looped through until the chemicals are within a target range (711). Upon completion of the process, the cycle is terminated (710) and the chemicals dispensed.

In some embodiments, a recycle loop may be used to recycle the process stream back to the mixing area if the process stream does not meet the predetermined composition formulation. Alternatively, the composition may be directed to a drain where the composition is disposed of or reused in another process, if the composition formulation is out of a predetermined range. One advantage of using a combination of a feed forward and feedback control system is that the amount of composition that is produced is minimized. This is due in part to the quick response time of the system. Additionally, the storage or error correction values helps the system create a composition that is close to the desired formulation when the process is initiated. By minimizing the amount of non-usable composition, a recirculation system may not be required. By eliminating recirculation of the composition, the system may be more responsive to user needs to modify the composition formulation during use of the system.

Figure 11:
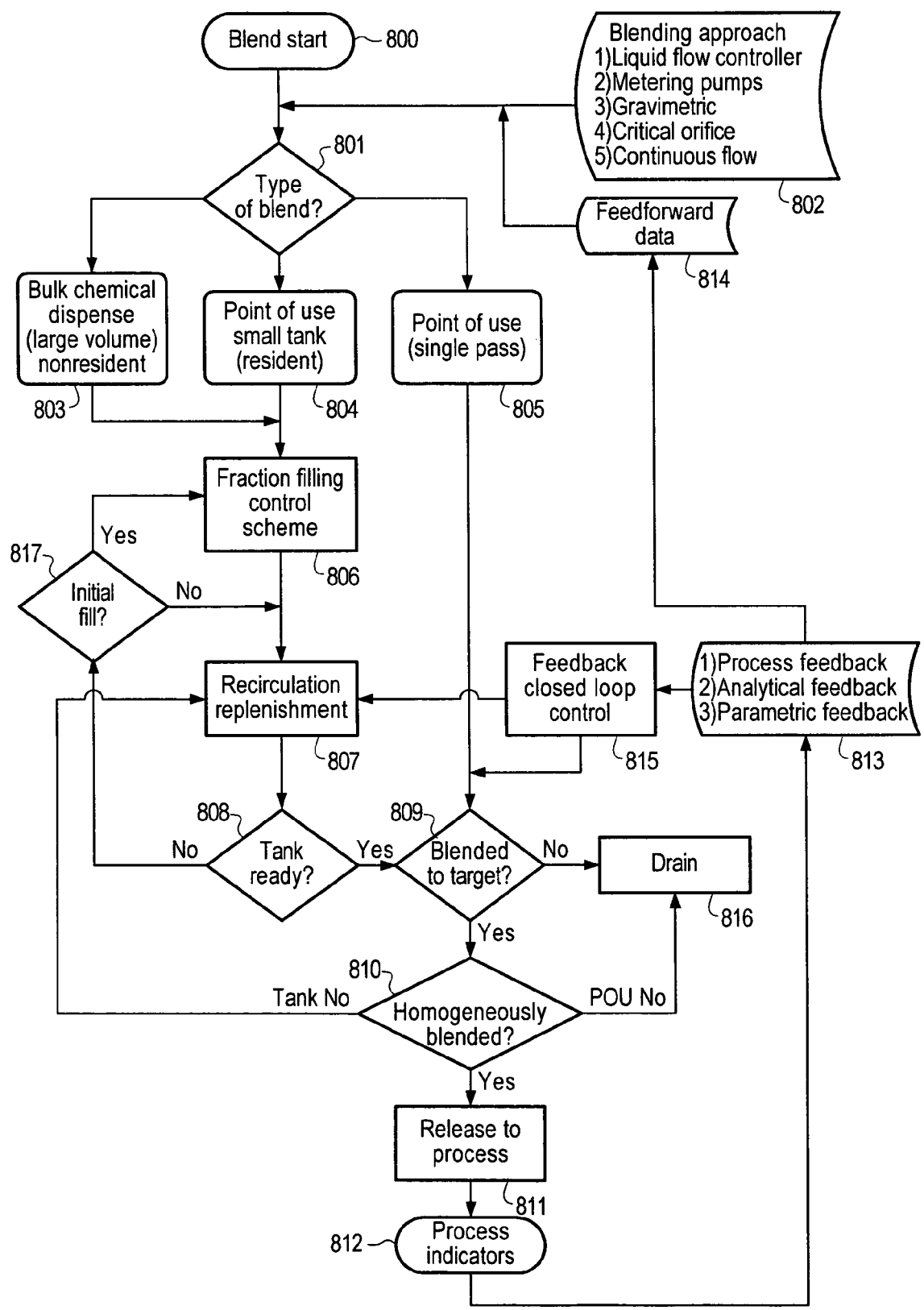
FIG. 11 is a flow chart for a general control method of mixing chemicals for both batch and continuous applications.

In an embodiment, a controller may be configured to control both point of use and batch processing methods. The system may include a combination of mixing areas and batch storage containers to allow multiple uses of the system. A general control method is presented in FIG. 11. Initiation of the process begins (800) and data regarding the specific parameters of the process are collected from the controller memory and the user. Information that is collected includes information regarding the type of device used to dispense each of the chemicals of the composition (802). Examples of dispensing methods include, but are not limited to liquid flow controllers, metering pumps, gravimetric dispensers, critical orifice dispensing and continuous flow.

After gathering the information regarding the system and user parameters, the type of process is chosen (801). The process choices, in some embodiments include bulk chemical dispense (803), point of use small container (804) and point of use—single pass (805). The bulk chemical dispense may be represented by a non-resident large volume container. A point of use small container may be a container that is resident on a process tool.

If either of the container options (803 or 804) are chosen, a fractional fill controlling scheme may be used (806). In some embodiments, a replenishment cycle is followed in which the container is replenished as the composition is used. This replenishment cycle is followed while chemistry is recirculated (807) and determination is made as to whether the container is full (808) and continues under the initial fill (817) until the fractional filling is complete.

Once the container is filled, confirmation of the blended target (809) is achieved and confirmed. If the target is not achieved, the blend may be discarded into a drain (816). In the case of a tank or container approach, recirculation may continue (807) until the feedback closed loop control scheme (815) achieves the desired target concentration.

In addition to blending to target (809) an additional requirement may be the homogeneity of the blend (810). If this is confirmed (810) then the blend maybe released to process (811). If the mixture does not meet the homogeneity requirements, a point of use single pass blend is sent to a drain, or a tank/container batch would be recirculated until homogeneity is achieved.

Process indicators (812) include, but are not limited to, endpoint detection, metrology or parametric values determined during the fabrication process. This feedback may be used to provide stored data for feed forward control (814) as well as for adjustment of feedback closed loop control (813).

Figure 12:
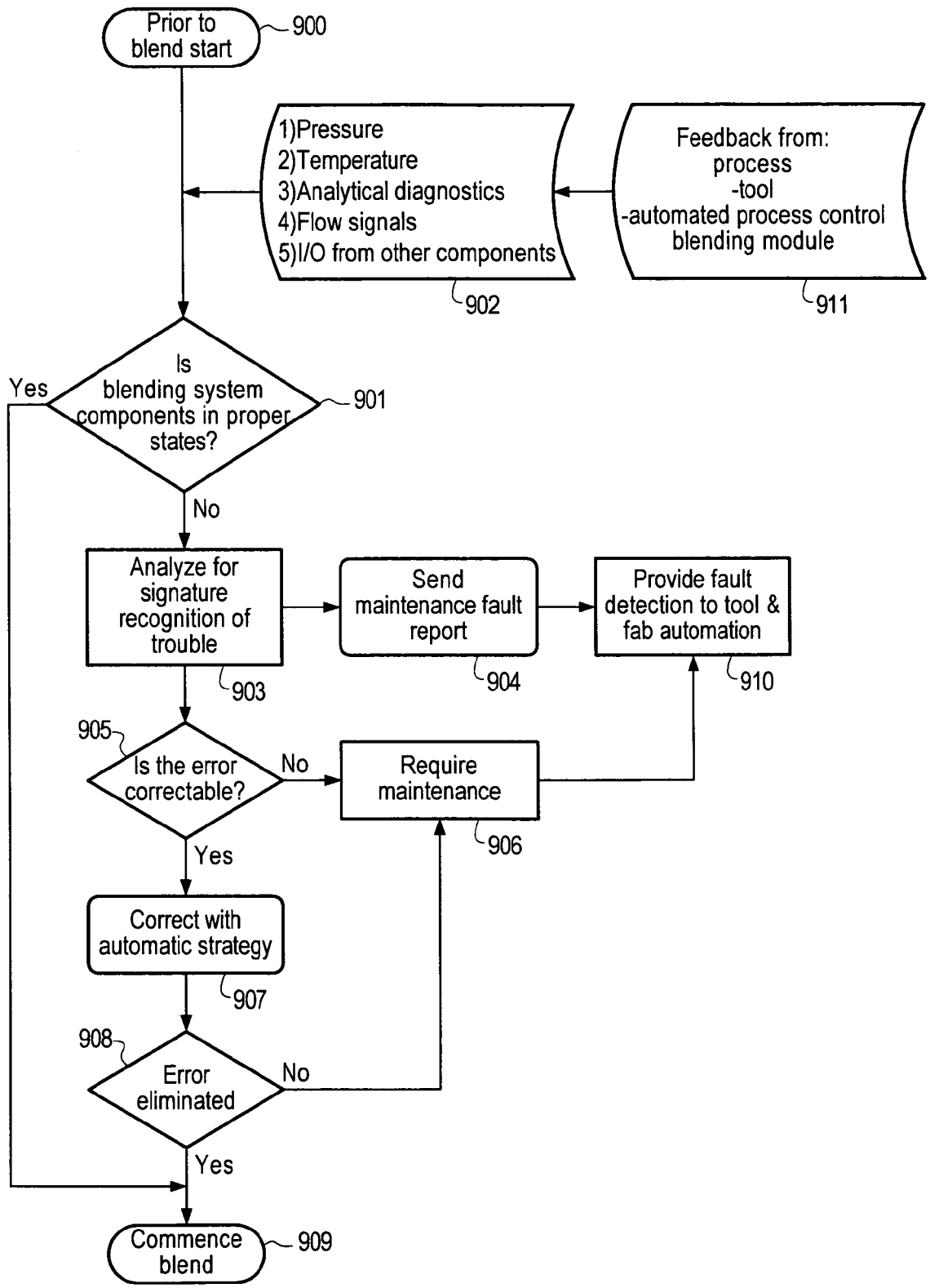
FIG. 12 is a flow chart for automatic fault detection and control for the chemical mixing system.

In an embodiment, a controller includes an automatic detection and correction of fault system. A flow chart of an automatic detection and correction of fault system is shown in FIG. 12. Prior to any blend all inputs 902 are analyzed to ensure that the normal "state" exists for any chemical or subassembly 901. The state or functioning of many components are analyzed prior to initializing the process. Examples of components of the blending system that are analyzed include: pressure of various fluid dispensing systems; temperature of the system at various positions; proper functioning of the analytical equipment; flow signals; and proper I/O received from components.

These conditions are then analyzed for signature failures 903 that either prevent blending 904 or allow an automatic correction strategy to be implemented 907. If the error is not correctable 905 or the error cannot be eliminated 908, a flag is provided to require maintenance 906. In any case an internal data log is generated to allow fast response for maintenance repair and the tool and fab automation are informed 910. After the initial blend cycle, subsequent blending also receives information via feedback from process which can come from the tool or APC (Automated Process Control) or from the various sensors present in the blending module 911.

All analyses disclosed herein are not limited to any one analytical approach. Absorption Spectroscopy which includes these classifications UV/VIS, NIR, MidIR, RAMAN as well as analytical instruments that provide output such as conductivity, refractive index, ultrasonic form a subset of the analytical approaches that could be used to analyze compositions.

In this patent, certain U.S. patents, U.S. patent applications, and other materials (e.g., articles) have been incorporated by reference. The text of such U.S. patents, U.S. patent applications; and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments.

Elements and materials may be substituted for those illustrated and described herein, parts and processes may be reversed, and certain features of the invention may be utilized independently, all as would be apparent to one skilled in the art after having the benefit of this description to the invention. Changes may be made in the elements described herein without departing from the spirit and scope of the invention as described in the following claims. In addition, it is to be understood that features described herein independently may, in certain embodiments, be combined.

What is claimed is:

1. A method of formulating a composition having a predetermined volume comprising two or more chemicals, each chemical being present in the composition in a predetermined quantity, the method comprising:

admitting at least two chemicals into a container to form a composition until the container is partially filled to a predetermined fraction of the predetermined volume;

blending the composition in the container;

determining the homogeneity of the blended composition;

continuing blending of the composition until the homogeneity of the composition is at least at a predetermined homogeneity value;

determining the quantity of each chemical needed to fill the container to the predetermined volume, or to a selected volume between the volume of the partially filled container and the predetermined volume, after the homogeneity of the composition is at least at a predetermined homogeneity value, wherein the quantity of each chemical is calculated as a function of the determined quantity of one or more of the chemicals in the composition; and dispensing the determined quantity of the chemicals to the container;

wherein the homogeneity is determined as a function of an average change in the quantity of one or more chemicals of the composition over a predetermined time period.

2. The method of claim 1, wherein determining an average change in quantity comprises:

taking a plurality of quantity measurements of the composition over a predetermined time period;

determining the change in quantity with respect to time for each quantity measurement;

determining one or more average change in quantity with respect to time of one or more of the chemicals;

determining the homogeneity of the composition, wherein the homogeneity of the composition is a function of one or more average changes.

3. The method of claim 2, wherein the composition comprises two or more chemicals, wherein the homogeneity of the composition is a function of the average change of two or more chemicals.

4. The method of claim 1, wherein determining the quantity of each chemical needed to fill the container to the predetermined volume comprises:

calculating a correction factor for at least one of the chemicals, wherein the correction factor is the ratio of a target quantity to the determined quantity for at least one of the chemicals in the partially filled container;

calculating the theoretical amount of each of the chemicals needed to fill the container to the predetermined volume by determining the difference between the predetermined quantity of chemical in the container when filled to the predetermined volume and the determined quantity of the chemical in the partially filled container; and calculating the actual amount of each of the chemicals needed to fill the container to the predetermined volume by multiplying one or more of the calculated theoretical amounts by the correction factor.

5. The method of claim 1, further comprising repeatedly performing the following until the predetermined volume of the composition is obtained:

determining the amount of each chemical needed to fill the container to one or more additional fractions of the predetermined volume, wherein the amount of each chemical added for each additional fraction is calculated as a function of the determined quantity of one or more of the chemicals in the partially filled container after the homogeneity of the intermediate composition is determined;

dispensing the determined amount of the chemicals into the container.

6. The method of claim 1, wherein if at least a portion of the composition is removed from the container, the method further comprises:

determining the quantity of one or more of the chemicals in the remaining composition;

determining the volume of chemicals needed to at least partially refill the container;

determining the amount of each chemical needed to produce the determined volume, wherein the amount of each chemical is calculated as a function of the determined quantity of one or more of the chemicals in the remaining composition; and dispensing the determined amount of the chemicals into the container.

7. The method of claim 1, wherein determining the quantity of one or more of the chemicals in the container comprises determining a weight percentage of one or more of the chemicals.

8. The method of claim 1, wherein one chemical of the composition is water.

9. The method of claim 1, wherein one chemical of the composition is an inorganic base.

10. The method of claim 1, wherein one chemical of the composition is ammonium hydroxide.

11. The method of claim 1, wherein one chemical of the composition is a mineral acid.

12. The method of claim 1, wherein one chemical of the composition is hydrogen peroxide.

13. The method of claim 1, wherein the composition comprises a mixture of animonium hydroxide, hydrogen peroxide, and water.

14. The method of claim 1, wherein the composition comprises a mixture of hydrogen chloride, hydrogen peroxide, and water.

15. The method of claim 1, wherein the composition comprises a mixture of sulfuric acid, hydrogen peroxide, and water.

16. The method of claim 1, wherein the composition comprises a mixture of ammonium hydroxide, hydrogen fluoride, and water.

17. The method of claim 1, wherein determining a quantity of one or more of the chemicals in the container comprises determining one or more spectroscopic properties of the composition.

18. The method of claim 17, wherein at least one of the spectroscopic properties is Raman spectroscopy.

19. The method of claim 1, wherein determining a quantity of one or more of the chemicals in the container comprises determining a conductance of the composition.

20. The method of claim 1, wherein one or more chemicals are supplied to the container from a bulk chemical storage, the method further comprising blending one or more of the chemicals with water prior to dispensing the chemical into the container.

21. The method of claim 1, wherein prior to dispensing at least two chemicals into the container, the method further comprises:
sending a zero point control signal from a controller to at least one chemical dispensing device, wherein the zero point control signal causes the chemical dispensing device to move to a zero flow state configuration;
detecting if a fluid is flowing through one or more of the chemical dispensing devices after the chemical dispensing device receives the zero point control signal, wherein if fluid flow is detected through one or more of the chemical dispensing devices, one or more of the chemical dispensing devices are adjusted until flow of fluid through the one or more chemical dispensing devices is inhibited.

22. The method of claim 1, further comprising transferring the composition to a semiconductor fabrication tool.

* * * * *